US006484532B2

(12) United States Patent
Driehuys

(10) Patent No.: US 6,484,532 B2
(45) Date of Patent: *Nov. 26, 2002

(54) NMR POLARIZATION MONITORING COILS, HYPERPOLARIZERS WITH SAME, AND METHODS FOR DETERMINING THE POLARIZATION LEVEL OF ACCUMULATED HYPERPOLARIZED NOBLE GASES DURING PRODUCTION

(75) Inventor: Bastiaan Driehuys, Durham, NC (US)

(73) Assignee: Medi-Physics, Inc., Princeton, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/938,248

(22) Filed: Aug. 23, 2001

(65) Prior Publication Data

US 2002/0029586 A1 Mar. 14, 2002

Related U.S. Application Data

(63) Continuation of application No. 09/344,000, filed on Jun. 30, 1999, now Pat. No. 6,295,834.

(51) Int. Cl.[7] ................................................. F25B 1/00
(52) U.S. Cl. ........................................... 62/637; 62/55.5
(58) Field of Search ................................. 62/637, 55.5

(56) References Cited

U.S. PATENT DOCUMENTS

| 4,080,429 A | 3/1978 | Koeppe et al. ............. 423/262 |
| 4,450,407 A | 5/1984 | Kwon et al. ................. 324/304 |
| 4,586,511 A | 5/1986 | Clark, Jr. ..................... 128/653 |

(List continued on next page.)

FOREIGN PATENT DOCUMENTS

| DE | 19742548 A | 4/1999 |
| EP | 0495287 A2 | 7/1992 |
| EP | 0620447 A2 | 10/1994 |
| JP | 62283616 A | 12/1987 |
| JP | 08316058 A | 11/1996 |
| WO | WO 97/29836 | 4/1997 |

(List continued on next page.)

OTHER PUBLICATIONS

Albert et al., "$^{129}$Xe Relaxation Catalysis by Oxygen", Abstracts of the 11th Annual Meetings of the Society for Magnetic Resonance Medicine, Abstract No. 4710 (1992).
Albert et al., "Biological magnetic resonance imaging using laser–polarized $^{129}$Xe," Letters to Nature, vol. 370, pp. 199–201 (Jul. 21, 1994).
Albert et al., Development of Hyperpolarized Noble Gas MRI, Nucl. Inst. And Meth. In Phys. Res. A 402, pp. 441–453 (1998).
Albert et al., Measurement of $^{129}$Xe T1 in Blood to Explore the Feasibility of Hyperpolarized $^{129}$Xe MRI, Jour. Comp. Ass. Tomography, vol. 19, No. 6 (Nov.–Dec. 1995).

(List continued on next page.)

Primary Examiner—Ronald Capossela
(74) Attorney, Agent, or Firm—Myers Bigel Sibley & Sajovec

(57) ABSTRACT

Hyperpolarizers which produce hyperpolarized noble gases include one or more on-board NMR monitoring coils configured to monitor the polarization level of the hyperpolarized gas at various production points in the polarized gas production cycle. A dual symmetry NMR coil is positioned adjacent the optical pumping cell and is in fluid communication with a secondary reservoir in fluid communication with the polarized gas dispensing or exit flow path. This can measure the post-thaw polarization of the gas "on-board" the polarizer. Alternately or additionally, a NMR monitoring coil is assembled to the exit port portion of the optical pumping cell to give a more reliable indication of the polarization level of the gas as it flows out of the gas optical pumping cell. Another NMR monitoring coil can be positioned in a cryogenic bath adjacent a quantity of frozen polarized $^{129}$Xe to determine the polarization level of the frozen gas.

27 Claims, 14 Drawing Sheets

U.S. PATENT DOCUMENTS

| | | | |
|---|---|---|---|
| 4,755,201 A | 7/1988 | Eschwey | 62/12 |
| 4,977,749 A | 12/1990 | Sercel | 62/51.1 |
| 5,039,500 A | 8/1991 | Shino et al. | 423/262 |
| 5,046,498 A | 9/1991 | Fishman | 128/653 |
| 5,161,382 A | 11/1992 | Missimer | 62/46.1 |
| 5,545,396 A | 8/1996 | Albert et al. | 424/93 |
| 5,612,103 A | 3/1997 | Driehuys et al. | 428/34.7 |
| 5,617,859 A | 4/1997 | Souza et al. | 128/653.2 |
| 5,617,860 A | 4/1997 | Chupp et al. | 128/653.4 |
| 5,642,625 A | 7/1997 | Cates, Jr. et al. | 62/55.5 |
| 5,809,801 A | 9/1998 | Cates, Jr. et al. | 62/637 |
| 5,833,947 A | 11/1998 | Rocklage et al. | 424/9.36 |
| 5,934,103 A | 8/1999 | Ryan et al. | 62/637 |
| 6,079,213 A | 6/2000 | Driehuys et al. | 62/3.1 |
| 6,085,743 A | 7/2000 | Rosen et al. | 128/200.24 |
| 6,237,363 B1 | 5/2001 | Zollinger et al. | 62/600 |
| 6,269,648 B1 | 8/2001 | Hasson et al. | 62/3.1 |

FOREIGN PATENT DOCUMENTS

| | | |
|---|---|---|
| WO | WO 97/37239 | 10/1997 |
| WO | WO98/02209 A2 | 1/1998 |
| WO | WO 98/58272 | 2/1998 |
| WO | WO 98/43701 | 8/1998 |
| WO | WO 99/07415 | 2/1999 |
| WO | WO99/08941 | 2/1999 |
| WO | WO 99/14582 | 3/1999 |
| WO | WO 99/17105 | 4/1999 |
| WO | WO 99/17304 | 4/1999 |
| WO | WO 99/25243 | 5/1999 |
| WO | WO99/35508 | 7/1999 |
| WO | WO 00/23797 | 4/2000 |

OTHER PUBLICATIONS

Albert et al., "Relaxation of $^{129}$Xe in Model Biological Systems: On Probing the Mechanism of General Anesthesia", Abstracts of the 11th Annual Meetings of the Society for Magnetic Resonance Medicine, Abstract No. 2104 (1992).

Arimoto, et al., "Development of Measurement and Control System for Polarized $^3$He Iron Source Based on Electron Pumping," The 11th Symposium on Accelerator Science and Technology, Harima Science Garden City, pp. 14–16 (1997).

Becker et al., "Study of Mechanical Compression of Spin–Polarized $^3$He Gas", Nuclear Instruments and Methods In Physics Research, vol. A 346, pp. 45–51 (1994).

Bhaskar et al., "Efficiency of Spin Exchange between Rubidium Spins and $^{129}$Xe Nuclei in a Gas", Physical Review Letters, vol. 49, No. 1, pp. 25–28 (Jul. 5, 1982).

Bifone, et al., "NMR of laser–polarized xenon in human blood," Proc. Natl. Acad. Sci. USA, vol. 93, pp. 12932–12936 (Nov. 1996).

Black et al., "In Vivo He–3 MR Images of Guinea Pig Lungs, Radiology," vol. 199, No. 3, pp. 867–870 (Jun. 1996).

Carver, T.R., "Optical Pumping," Science, vol. 141, No. 3581, pp. 599–608 (1963).

Cates et al., "Laser Production of Large Nuclear–Spin Polarization in Frozen Xenon", Phys. Rev. Lett., vol. 65, No. 20, pp. 2591–2594 (1990).

Cates et al., "Rb–$^{129}$Xe spin–exchange rates due to binary and three–body collisions at High Xe pressures", Physical Review A, vol. 45, p. 4631 (1992).

Cates, "New Results from Spin–Exchange Optical Pumping," Am. Inst. Phys. pp. 3–15 (1998).

Cullen, et al., Science, vol. 113, pp. 580–582 (May 18, 1951).

Cummings et al., "Optical pumping of Rb vapor using high–power $Ga_{1-x}A_x$ as diode laser arrays," Phys. Rev. A, vol. 51, No. 6, pp. 4842–4851 (1995).

De Schepper, "The HERMES $^3$He target," AIP Conf. Proc., vol. 421, No. 1, pp. 16–25 (Jan. 1998).

Driehuys et al., "High–volume production of laser–polarized $^{129}$Xe", Appl. Phys. Lett., vol. 69, No. 12, pp. 1668–1670 (Sep. 16, 1996).

Driehuys et al., "Surface Relaxation Mechanisms of Laser–Polarized 129Xe," 74 Phys. Rev. Lett., No. 24, pp. 4943–4946 (Jun. 12, 1995).

Freed, "Dynamic Effects of Pair Correlation Functions on Spin Relaxation by Translational Diffusion in Liquids. II. Finite Jumps and Independent $T_1$ Processes," 68 J. Chem. Phys., vol. 9, pp. 4034–4037 (1978).

Gatzke et al., "Extraordinary Slow Nuclear Spin Relaxation in Frozen Lazer–Polarized $^{129}$Xe", Phys. Rev. Lett., vol. 70, No. 5, pp. 690–693 (Feb. 1, 1993).

Glover et al., Research Directions in MR Imaging[1], Radiology, vol. 207, pp. 289–295, (1998).

Happer et al., "Polarization of the nuclear spins of noble–gas atoms by spin exchange with optically pumped alkali–metal atoms," Phys. Rev. A, vol. 29, No. 6, p. 3092–3110 (Jun. 1984).

Heil et al., "Very long nuclear relaxation times of spin polarized helium 3 in metal coated cells," Physics Letters A 201, pp. 337–343 (1995).

Hou, et al., "Optimization of Fast Acquisition Methods for Whole–Brain Relative Cerebral Blood Volume (rCBV) Mapping with Susceptibility Contrast Agents," J. Mag. Res. Imaging, vol. 9 pp. 233–239 (1999).

Kaatz et al., "A comparison of molecular hyperpolarizabilities from gas and liquid," J. Chem. Phys., vol. 108, No. 3, pp. 849–856 (Jan. 15, 1998).

Long et al., "High–Field Cross Polarization NMR from Laser–Polarized Xenon to a Polymer Surface," J. Am. Chem. Soc., vol. 115, pp. 8491–8492 (1993).

Lunsford et al., "In Vivo Biological Effects of Stereotactic Radiosurgery: A Primate Model," Neurosurgery, vol. 27, No. 3, pp. 373–382 (Sep. 1990).

Manabe et al., "O.1–T Human Fat/Water Separation by SIDAC," Mag. Reson. In Med., vol. 5, pp. 492–501 (1987).

Middleton et al., "MR Imaging With Hyperpolarized $^3$He Gas", Magnetic Resonance In Medicine, vol. 33, pp. 271–275 (1995).

Middleton, "The Spin Structure of the Neutron Determined Using A Polarized $^3$He Target", Ph.D. Dissertation, Princeton University (Nov. 1994).

Moller et al., "Signal Dynamics in Magnetic Resonance Imaging of the Lung with Hyperpolarized Noble Gases," J. Mag. Res., vol. 135, pp. 133–143 (1998).

Mugler, III et al. Gradient–Echo MR Imaging, RSNA Categorical Course in Physics: The Basic Physics of MR Imaging[1], U. of VA Health Sci. Ctr., pp. 71–88 (1997).

Mugler, III et al., "MR Imaging and Spectroscopy Using Hyperpolarized 129Xe Gas: Preliminary Human Results," 37 Magn. Reson. In Med., vol. 37, No. 6, pp. 809–815 (1997).

Navon et al., "Enhancement of Solution NMR and MRI with Laser–Polarized Xenon," Science, vol. 271, pp. 1848–1851 (Mar. 1996).

Patyal, "Longitudinal Relaxation and Diffusion Measurements Using Magnetic Resonance Signals from Laser–Hyperpolarized $^{129}$Xe Nuclei," J. Magn. Reson., vol. 126, No. 1, pp. 58–65, May 1997.

Pennisi, Breathe (xenon) deeply to see lungs clearly, Sci. News, vol. 146, p. 70.

Romalis et al., "Accurate $^3$He Polarimetry Using the Rb Zeeman Frequency Shift Due to the Rb– $^3$He Spin–Exchange Collisions," Phys. Rev. A, vol. 58, No. 4, pp. 3004–3011 (Oct. 1998).

Romalis et al., "Toward precision polarimetry of dense polarized $^3$He targets," Nucl. Instr. and Meth. in Phys Res. A, vol. 402, pp. 260–267 (1998).

Rosen et al., Polarized $^{129}$Xe optical pumping/spin exchange and delivery system for magnetic resonance spectroscopy and imaging studies, Rev. Sci. Instrum, vol. 70, No. 2, pp. 1546–1552 (Feb. 1999).

Ruth et al., "Production of Nitrogen–Free, Hyperpolarized $^{129}$Xe Gas," Appl. Phys. B, vol. 68, pp. 93–97 (1999).

Saam et al., "Low Frequency NMR Polarimeter for Hyperpolarized Gases," J. of Mag. Res., vol. 134, pp. 67–71 (1998).

Saam et al., "Nuclear Relaxation of $^3$He in the Presence of O$_2$," Phys. Rev. A, vol. 52, pp. 862–865 (1995).

Saam et al., Edge Enhancement Observed with Hyperpolarized $^3$HE, Chem. Phys. Ltrs., vol. 263, pp. 481–487 (1996).

Sauer et al., "Laser–Polarized Liquid Xenon," Chem. Phys. Lett., vol. 277, pp. 153–158 (Oct. 3, 1997).

Song et al., "Spin–Polarized $^{129}$Xe Gas Imaging of Materials," J. Mag. Reson., Series A 115, pp. 127–130 (1995).

Wagshul et al., "Laser Optical Pumping of High–Density Rb in Polarized $^3$He Targets," Phys. Rev. A, vol. 49, p. 3854–3869 (1994).

Wagshul et al., "Optical Pumping of High–Density Rb With a Broadband Dye Laser and GaA1As Siode Laser Arrays: Application to $^3$He Polarization," Phys. Rev. A., vol. 40, No. 8, pp. 4447–4454 (1989).

Wehrli, F.W. et al., eds., Biomedical Magnetic Resonance Imaging, Principles, Methodology, and Applications, Chapter 1 (1988).

Wu et al., "Experimental Studies of Wall Interactions of Adsorbed Spin–Polarized $^{131}$Xe Nuclei," Phys. Rev. A, vol. 42, No. 5, pp. 2774–2784 (Sep. 1, 1990).

Yen, W.M. et al., "Nuclear Magnetic Resonance of Xe129 in Solid and Liquid Xenon," Phys. Rev., 131:269 (1963).

Yonehara et al., "Design of Rb Cell for Polarized $^3$He Ion Source Based on Electron Pumping," The 11th Symp. on Accelerator Sci. & Tech., Harima Sci. Garden City, pp. 174–175 (1997).

Zeng et al., "Experimental determination of the rate constants for spin exchange between optically pumped K, Rb, and Cs atoms and $^{129}$Xe nuclei in alkali–metal–noble–gas van der Waals molecules," Physical Review A, vol. 31, No. 1, pp. 260–278 (Jan. 1985).

Zeng et al., "Wall Relaxation of Spin Polarized $^{129}$Xe Nuclei," Phys. Ltrs., vol. 96A, No. 4 (Jun. 27, 1983).

PCT International Search Report, International Appl. No. PCT/US00/17118, mailed Aug. 12, 2000.

PCT International Search Report, International Appl. No. PCT/US00/17118, mailed Feb. 22, 2001.

Brunner et al., "Communications: Gas Flow MRI Using Circulating Laser–Polarized $^{129}$Xe," J. Mag. Res. vol. 138, pp. 155–159 (1999).

Happer et al., "An Optical Pumping Primer," Hyperfine Interactions, vol. 38, pp. 435–470 (1987).

Jaduszliwer et al., "Optical spin polarization and state–sensitive detection of a cesium atomic beam," Phys. Rev. A, vol. 48, No. 3, pp. 2102–2107 (Sep. 1993).

Mair et al., "Magnetic Resonance Imaging of Convection in Laser–Polarized Xenon," Phys. Rev. E, vol. 61, No. 3 (Mar. 2000).

Wagshul, M.E., "Polarization of $^3$He by Spin Exchange with High Density Laser Optically Pumped Rb Vapor," Thesis, Department of Physics, Harvard University (Nov. 1991).

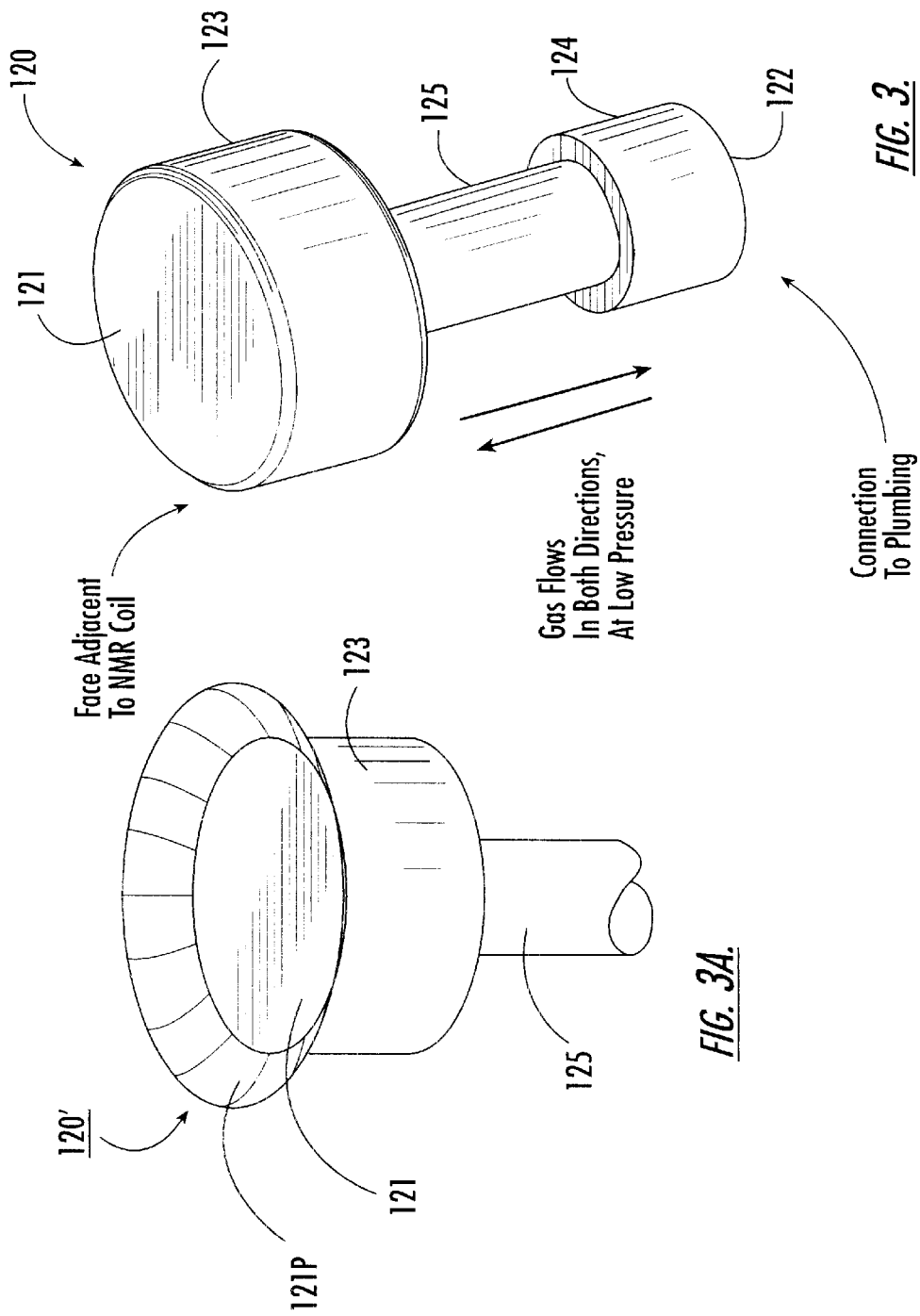

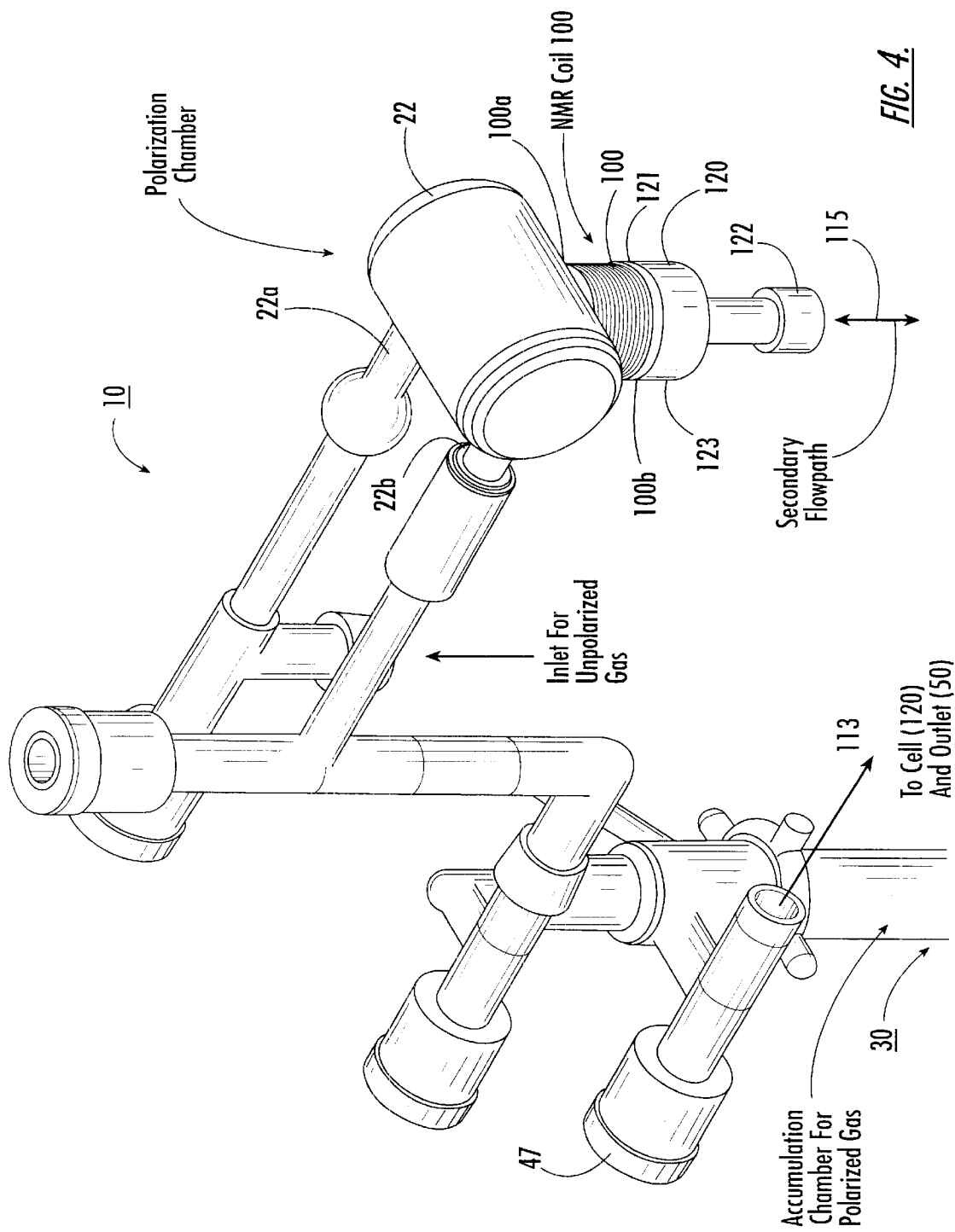

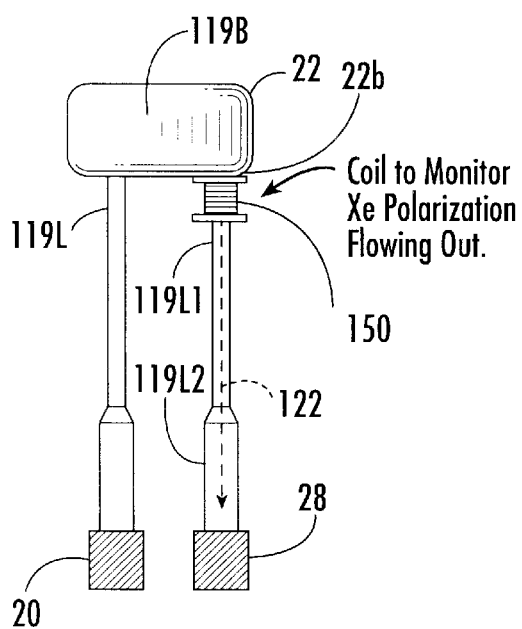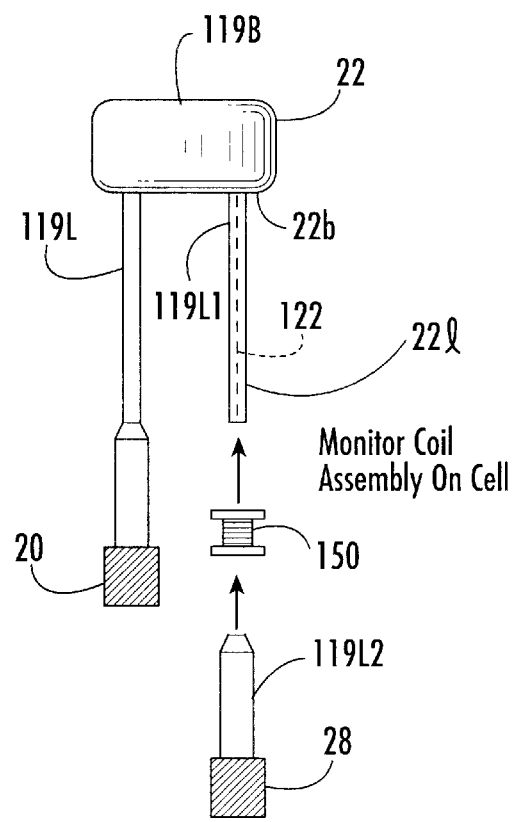
FIG. 7A.
FIG. 7B.

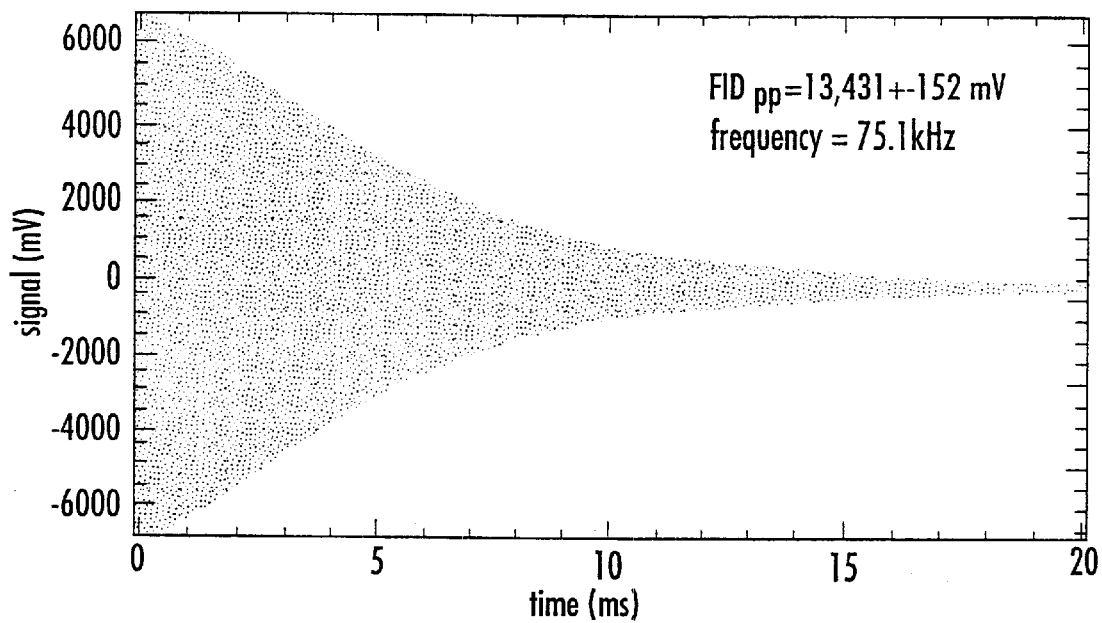
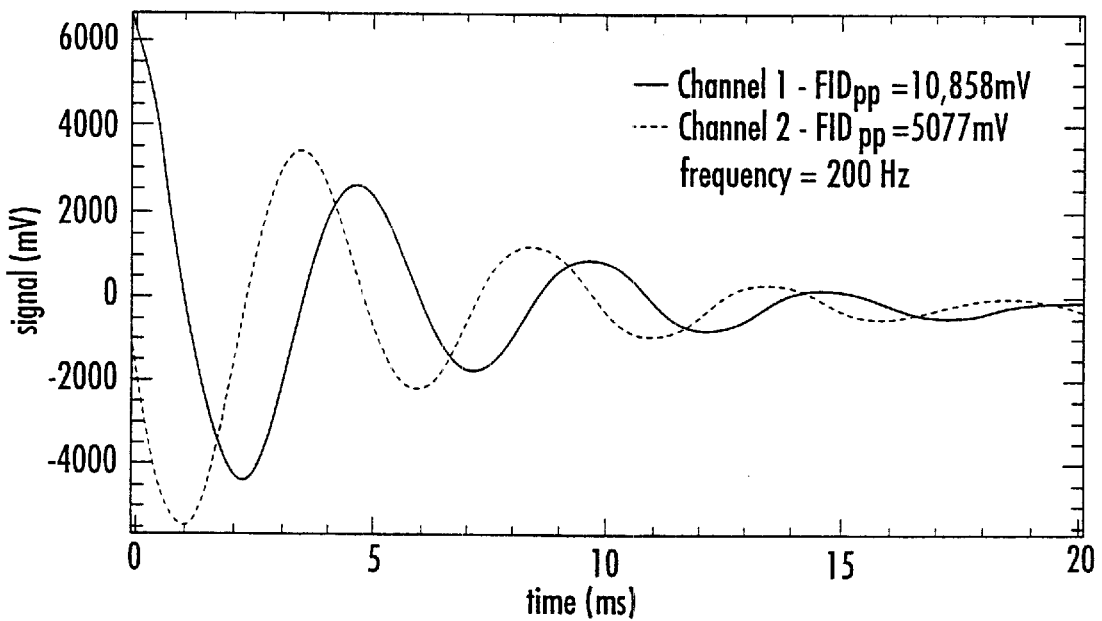
*FIG. 13.*
*PRIOR ART*

NMR POLARIZATION MONITORING COILS, HYPERPOLARIZERS WITH SAME, AND METHODS FOR DETERMINING THE POLARIZATION LEVEL OF ACCUMULATED HYPERPOLARIZED NOBLE GASES DURING PRODUCTION

RELATED APPLICATION

This application is a continuation of U.S. Application Ser. No. 09/344,000 filed Jun. 30, 1999 Now U.S Pat. No. 6,295,834. The contents of this document are hereby incorporated by reference as if recited in full herein.

FIELD OF THE INVENTION

The present invention relates to the collection and accumulation of polarized noble gases, and relates more particularly to the determination of the level of polarization of hyperpolarized gases used in NMR and magnetic resonance imaging ("MRI") applications.

BACKGROUND OF THE INVENTION

It has recently been discovered that polarized inert noble gases can produce improved MRI images of certain areas and regions of the body which have heretofore produced less than satisfactory images in this modality. Polarized helium-3 ("$^3$He") and xenon-129 ("$^{129}$Xe") have been found to be particularly suited for this purpose. Unfortunately, as will be discussed further below, the polarized state of the gases are sensitive to handling and environmental conditions and can, undesirably, decay from the polarized state relatively quickly. Further, because of the sensitivity of the polarized gas, it is desirable to monitor the polarization level of the gas at various times during the product's life. For example, in-process monitoring can indicate the polarization achieved during the optical pumping process (described below) or the polarization lost at certain phases of the life cycle process (so as to determine the remaining useable life of the polarized gas or to help identify critical production path issues).

Hyperpolarizers are used to produce and accumulate polarized noble gases. Hyperpolarizes artificially enhance the polarization of certain noble gas nuclei (such as $^{129}$Xe or $^3$He) over the natural or equilibrium levels, i.e., the Boltzmann polarization. Such an increase is desirable because it enhances and increases the MRI signal intensity, allowing physicians to obtain better images of the substance in the body. See U.S. Pat. No. 5,545,396 to Albert et al., the disclosure of which is hereby incorporated herein by reference as if recited in fill herein.

In order to produce the hyperpolarized gas, the noble gas is typically blended with optically pumped alkali metal vapors such as rubidium ("Rb"). These optically pumped metal vapors collide with the nuclei of the noble gas and hyperpolarize the noble gas through a phenomenon known as "spin-exchange." The "optical pumping" of the alkali metal vapor is produced by irradiating the alkali-metal vapor with circularly polarized light at the wavelength of the first principal resonance for the alkali metal (e.g., 795 nm for Rb). Generally stated, the ground state atoms become excited, then subsequently decay back to the ground state. Under a modest magnetic field (10 Gauss), the cycling of atoms between the ground and excited states can yield nearly 100% polarization of the atoms in a few microseconds. This polarization is generally carried by the lone valence electron characteristics of the alkali metal. In the presence of non-zero nuclear spin noble gases, the alkali-metal vapor atoms can collide with the noble gas atoms in a manner in which the polarization of the valence electrons is transferred to the noble-gas nuclei through a mutual spin flip "spin-exchange."

In any event, after the spin-exchange has been completed, the hyperpolarized gas is separated from the alkali metal prior to introduction into a patient (to form a non-toxic pharmaceutically acceptable product). Unfortunately, both during and after collection, the hyperpolarized gas can deteriorate or decay relatively quickly (lose its hyperpolarized state) and therefore must be handled, collected, transported, and stored carefully. Thus, handling of the hyperpolarized gases is critical, because of the sensitivity of the hyperpolarized state to environmental and handling factors and the potential for undesirable decay of the gas from its hyperpolarized state.

Some accumulation systems employ cryogenic accumulators to separate the buffer gas from the polarized gas and to freeze the collected polarized gas. Co-pending and co-assigned U.S. patent application Ser. No. 08/989,604 to Driehuys et al. describes a suitable accumulator and method of cryogenically collecting, freezing, and then thawing frozen polarized xenon. The contents of this application are hereby incorporated by reference as if recited in full herein.

Conventionally, the level of polarization has been monitored at the polarization transfer process point (i.e., at the polarizer or optical cell) in a hyperpolarizer device or measured at a site remote from the hyperpolarizer after the polarized gas is dispensed from the hyperpolarizer. For example, for the latter, the polarized gas is directed to an exit or dispensing port on the hyperpolarizer and into two separate sealable containers, a gas delivery container, such as a bag, and a small (about 5 cubic centimeter) sealable glass bulb specimen container. This glass bulb specimen container is then sealed at the hyperpolarizer site and then carried away from the hyperpolarizer to a remotely located high-field NMR spectroscopy unit (4.7T) to determine the level of polarization achieved during the polarization process. See J. P. Mugler, B. Driehuys, J. R. Brookeman et al., *MR Imaging and Spectroscopy Using Hyperpolarized 129Xe Gas; Preliminary Human Results,* Mag. Reson. Med. 37, 809–815 (1997).

Generally stated, as noted above, conventional hyperpolarizers may also monitor the polarization level achieved at the polarization transfer process point, i.e., at the optical cell or optical pumping chamber. In order to do so, typically a small "surface" NMR coil is positioned adjacent the optical pumping chamber to excite and detect the gas therein and thus monitor the level of polarization of the gas during the polarization-transfer process. The small surface NMR coil will sample a smaller volume of the proximate polarized gas and thus have a longer transverse relaxation time ($T_2^*$) compared to larger NMR coil configurations. A relatively large tip angle pulse can be used to sample the local-spin polarization. The large angle pulse will generally destroy the local polarization, but because the sampled volume is small compared to the total size of the container, it will not substantially affect the overall polarization of the gas.

Typically, the surface NMR coil is operably associated with low-field NMR detection equipment which is used to operate the NMR coil and to analyze the detected signals. Examples of low-field NMR detection equipment used to monitor polarization at the optical cell and to record and analyze the NMR signals associated therewith include low-field spectrometers using frequency synthesizers, lock-in amplifiers, audio power amplifiers, and the like, as well as computers.

In any event, it is now known that on-board hyperpolarizer monitoring equipment no longer requires high-field NMR equipment, but instead can use low-field detection techniques to perform polarization monitoring for the optical cell at much lower field strengths (e.g., 1–100 G) than conventional high-field NMR techniques. This lower field strength allows correspondingly lower detection equipment operating frequencies, such as 1–400 kHz.

For applications where the entire hyperpolarized gas sample can be located inside the NMR coil, an adiabatic fast passage ("AFP") technique has been used to monitor the polarization of the gas in this type of situation. Unfortunately, in most production-oriented situations, this technique is not desirable. For example, in order to measure the polarization in a one-liter patient dose bag, a relatively large NMR coil and spatially large magnetic field is needed.

More recently, Saam et al. has proposed a low-frequency NMR circuit expressly for the on-board detection of polarization levels for hyperpolarized $^3$He at the optical cell inside the temperature-regulated oven which encloses the cell. See Saam et al., *Low Frequency NMR Polarimeter for Hyperpolarized Gases,* Jnl. of Magnetic Resonance 134, 67–71 (1998). Magnetic Imaging Technologies, Inc. ("MITI") and others have used low-field NMR apparatus for on-board polarization measurement.

However, there remains a need to be able to efficiently and reliably determine and/or monitor the level of polarization of polarized gases in various points in the production cycle. This is particularly important for the flowing production modality used for cryogenically accumulated $^{129}$Xe, which as noted above, is frozen and thawed during the production cycle.

OBJECT AND SUMMARY OF THE INVENTION

In view of the foregoing, it is an object of the present invention to provide methods and apparatus to efficiently monitor the hyperpolarization level of a quantity of hyperpolarized gas at various points in the production cycle.

It is an additional object of the present invention to provide a hyperpolarizer with means to monitor the polarization level of cryogenically accumulated hyperpolarized gas both before the gas is frozen and after the gas is thawed.

It is another object of the present invention to provide a method and device for monitoring the polarization level of flowing hyperpolarized gas which can be used in a substantially continuous gas-flow production environment.

It is a further object of the present invention to provide an apparatus and method which reduces the complexity and number of components needed to monitor the level of polarization in the polarized gas both during the optical pumping process and subsequent to the optical pumping process.

It is still another object of the present invention to provide an apparatus to monitor the polarization level of frozen polarized gas.

It is an additional object of the present invention to provide an apparatus that can improve the predictability of a cryogenic hyperpolarized gas production process.

It is a still further object of the present invention to provide an apparatus that can reliably yield sufficient levels of polarized gas during post accumulation thaw.

These and other objects are satisfied by the present invention by a hyperpolarizer apparatus with one or more NMR coils configured to provide "on-board" polarization monitoring level information at more than one point during the production cycle. In a preferred embodiment, the hyperpolarizer includes a dual symmetry NMR coil configuration which allows the same NMR coil and detection circuit to be used to measure $^{129}$Xe polarization both in the optical cell before cryogenic accumulation and in a post thaw bulb after cryogenic accumulation thawing.

In particular, a first aspect of the invention is directed to a hyperpolarizer for producing polarized noble gases. The hyperpolarizer comprises an optical pumping cell having a non-polarized gas inlet port and a polarized gas outlet port and a magnetic field source operably associated with the optical pumping cell. The magnetic field source is configured to provide a region of homogeneity. The hyperpolarizer also includes a NMR coil having first and second opposing ends. The first end is positioned adjacent the optical pumping cell within the region of homogeneity. The hyperpolarizer also includes a cryogenic accumulator in fluid communication with the optical pumping cell outlet port and a polarized gas dispensing port in fluid communication with the cryogenic accumulator. A polarized gas exit flow path extends between said cryogenic accumulator and the polarized gas dispensing outlet and a secondary reservoir is positioned adjacent the NMR coil second end in fluid communication with the polarized gas exit flow path. During operation of the hyperpolarizer, the NMR coil is configured to excite one of a quantity of polarized gas positioned in the optical cell and a quantity of polarized gas positioned in the secondary reservoir. Preferably, the NMR coil primarily monitors the polarization in the optical cell during operation of the cell, but during post-thaw, the polarization in the optical cell is gone and the only measurable signal will arise from the polarized gas in the post thaw bulb.

In a preferred embodiment, the magnetic field source defines a region of homogeneity which includes a portion of the optical pumping cell and a (spatial) volume which extends a distance below the optical pumping cell. The NMR coil is positioned on a bottom portion of the optical pumping cell, and the NMR coil and at least a portion of the secondary reservoir are positioned within the region of homogeneity.

Another aspect of the present invention is a secondary reservoir for a hyperpolarizer unit. The secondary reservoir is configured to hold a quantity of hyperpolarized noble gas therein and comprises opposing first and second end portions defining a gas flow path therebetween. The first end portion is configured to capture a quantity of hyperpolarized gas therein. The second end-portion has an opening formed therein and is configured to engage with a portion of a (hyperpolarized) gas flow line. Preferably, the first end is configured with a thin wall.

An additional aspect of the present invention is a dual symmetry NMR coil for monitoring the level of polarization associated with polarized gas in two different locations. The dual symmetry NMR coil comprises first and second opposing flanges and an intermediate coil section positioned therebetween. The thickness of the first and second flanges are substantially the same.

Still another aspect of the present invention is a hyperpolarizer for producing polarized noble gases. The hyperpolarizer comprises an optical pumping cell having a primary body and a longitudinally extending polarized gas outlet port with an outer surface. The hyperpolarizer includes a magnetic field source operably associated with the optical pumping cell. The magnetic field source is configured to provide a region of homogeneity. The hyperpolarizer also includes a first NMR coil having first and second opposing ends and defining a center aperture therethrough. The first NMR coil is positioned on the outlet port such that the outlet port longitudinally extending portion extends through the first NMR coil aperture. The first end of the first NMR coil being positioned adjacent the primary body of the optical pumping cell within the region of homogeneity. During operation of the hyperpolarizer, the first NMR coil is configured to excite a quantity of polarized gas positioned proximate to the optical cell outlet port. In a preferred embodiment, the hyperpolarizer includes a second and third NMR monitoring coil positioned at other selected points in the production cycle.

A preferred method of operating an NMR coil positioned proximate to the optical cell outlet port, includes flowing the hyperpolarized gas through the optical cell and out the port at a desired rate. The hyperpolarized gas flow is preferably temporally stopped or slowed and a NMR signal is taken via the coil on the outlet port (or arm) and the flow is then resumed. This configuration and method can generate a signal which is representative of the flowing hyperpolarized gas as it exits the optical cell.

Another aspect of the present invention is directed to another hyperpolarizer embodiment for producing optically pumped polarized noble gases. The hyperpolarizer comprises an optical pumping cell having a non-polarized gas inlet port and a polarized gas outlet port and a primary body. The hyperpolarizer also includes a cryogenic accumulator in fluid communication with the optical pumping cell outlet port. The cryogenic accumulator comprises an elongated closed end tube defining a polarized gas collection chamber for holding a quantity of collected polarized gas therein. The gas collection chamber is operably associated with first and second sealable valves. The cryogenic accumulator also includes a cryogenic bath, wherein the collection chamber is immersed into the cryogenic bath. The cryogenic accumulator also includes a set of permanent magnets arranged to provide a magnetic field with a region of homogeneity adjacent the collection chamber in the cryogenic bath and a first NMR coil positioned in the cryogenic bath adjacent the closed end of the tube in the magnetic field region of homogeneity. The hyperpolarizer also includes a polarized gas dispensing outlet in fluid communication with the cryogenic accumulator and a polarized gas exit flow path extending from the cryogenic accumulator to a polarized gas dispensing outlet. During operation of the hyperpolarizer, the first NMR coil is configured to monitor the level of polarization in the polarized gas in the closed end of the collection tube.

Yet another aspect of the present invention is a method for monitoring the polarization level of polarized gas during production. The method includes polarizing a quantity of noble gas in an optical pumping chamber and directing the polarized noble gas in the optical pumping chamber to a gas collection path. A magnetic field having a region of homogeneity is provided; the region of homogeneity preferably includes at least a volume of space associated with a portion of the optical pumping chamber and the gas collection path proximate to the optical pumping chamber. A first NMR coil is positioned adjacent the gas flow path in the magnetic field region of homogeneity and the polarized gas is excited by transmitting an excitation signal to the first NMR coil. The level of polarization associated with the hyperpolarized gas adjacent to the NMR coil is measured to thereby monitor the level of polarization associated with the polarized gas in a region of the polarizer adjacent the polarized gas flow path.

In a preferred embodiment, the optical pumping chamber has a primary body portion and a polarized gas exit port defined by a longitudinally extending leg, and the NMR excitation coil is positioned around the leg adjacent the primary body portion of the optical pumping chamber. It is also preferred that the method further comprise cryogenically accumulating the polarized gas in a cryogenic accumulator during which a portion of the polarized gas is frozen and then subsequently thawing the frozen polarized gas prior to the dispensing step and after the thawing step. It is also preferred that during or after the thawing step, a minor portion of the quantity of thawed polarized gas is directed away from a major portion of the hyperpolarized gas into the gas flow path proximate to the NMR coil.

Yet still another aspect of the present invention is directed to a hyperpolarized gas optical pumping cell having an integrated NMR coil. The integrated cell includes an optical pumping cell which has a primary body and at least one longitudinally extending leg portion. The integrated cell also includes a NMR coil having opposing first and second ends and an aperture formed through the center thereof. The first end is configured to receive a portion of said longitudinally extending leg therein and attach to the optical pumping cell. Preferably, the NMR coil attaches to the leg adjacent the primary body along the gas exit flow path.

It is an additional aspect of the present invention to provide a method for releasing the post-thaw cryogenically accumulated hyperpolarized gas in a hyperpolarizer having a cold finger collection container and exit flow path plumbing associated therewith. The method includes the steps of cryogenically accumulating a quantity of frozen hyperpolarized gas in a cold finger and monitoring a pressure associated with the cryogenically collected gas in the cold finger. (After cryogenic accumulation, flow is stopped and residual gases are evacuated, and heat is applied to start the thaw). At least a portion of the quantity of frozen hyperpolarized gas in the cold finger is thawed. The pressure in the cold finger is increased in response to the phase transition of the frozen hyperpolarized gas from a substantially frozen sample into a thawed fluid sample. The thawed hyperpolarized fluid sample is released as a gas from the cold finger responsive to a predetermined pressure associated with the cold finger corresponding to said monitoring step. In a preferred embodiment, the frozen gas transitions directly to a liquid phase and releasing step is performed in response to the opening of a valve downstream of the cold finger in the hyperpolarizer and both the thawing and releasing steps are performed on-board the hyperpolarizer.

Advantageously, the present invention can monitor the polarization during production and even at the dispensing port where convenient MRI patient-sized quantities (such as 0.5–2 liters of polarized gas) are directed out of the hyperpolarizer. As such, the polarization level at shipping or before storage is readily identifiable before the container is detachably released from the hyperpolarizer unit for easy transport to a remote site. The improved on-board in-process polarization monitoring can improve production and conveniently indicate the level of polarization of gas at several key points including at the dispensing port. Further, the dual symmetry NMR coil can allow a single NMR coil to measure polarization both at the optical cell during the optical pumping process and at a second point in the production cycle, such as at a post-thaw position. Further, the instant invention now configures a cold finger to release cryogenically accumulated hyperpolarized xenon dependent on a more predictable indicator, pressure. Because the release of the thawed gas at a predetermined pressure is less dependent on process variations such as flow rates and collected quantities of gas, a more predictable process can be obtained, thereby providing a more reliably controllable production capability.

The foregoing and other objects and aspects of the present invention are explained in detail herein.

BRIEF DESCRIPTION OF THE DRAWINGS

FIG. 3 is an enlarged perspective view of a secondary reservoir according to the present invention.

FIG. 3A is an enlarged perspective view of an alternate embodiment of a secondary reservoir according to the present invention.

FIG. 4 is a perspective view of a partial plumbing layout for a hyperpolarizer with a NMR coil and secondary reservoir according to the present invention.

FIG. 7A is a front view of an optical cell and NMR coil illustrating the NMR coil positioned along the exit gas flow path of the optical cell according to one embodiment of the present invention.

FIG. 7B is an exploded view of the optical cell and NMR coil of FIG. 7A illustrating a fabrication method for positioning a NMR monitoring coil along the exit flow path of the hyperpolarizer of FIG. 6 according to the present invention.

FIG. 9A is an enlarged schematic illustration of the NMR coil configured as a solenoid coil as shown in FIG. 9.

FIG. 13 is a graph illustrating prior art detection methods showing a comparison of a direct-detect FID with a typical mixed-down two channel FID.

DETAILED DESCRIPTION OF THE PREFERRED EMBODIMENTS

Figure 1:
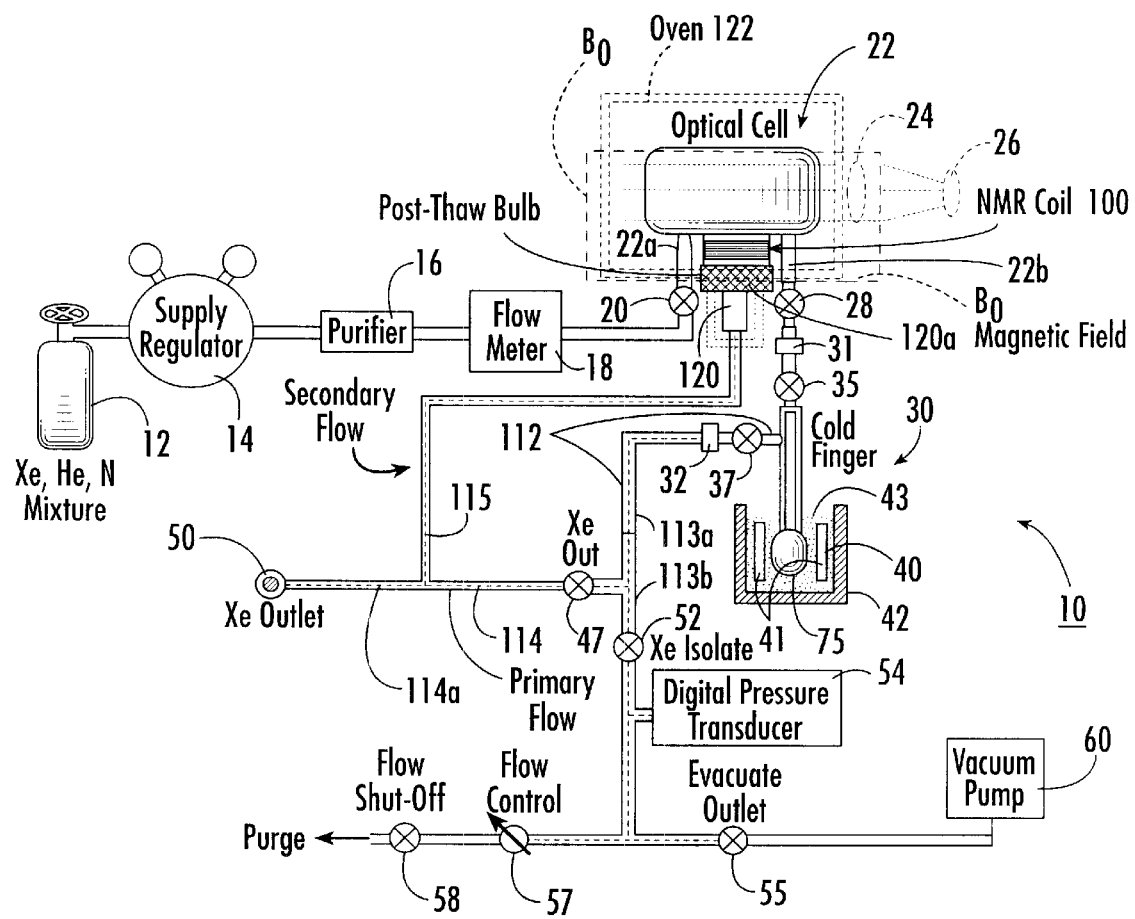
FIG. 1 is a schematic illustration of a hyperpolarizer apparatus according to one embodiment of the present invention.

The present invention will now be described more fully hereinafter with reference to the accompanying figures, in which preferred embodiments of the invention are shown. This invention may, however, be embodied in many different forms and should not be construed as limited to the embodiments set forth herein. Like numbers refer to like elements throughout. In the drawings, layers, regions, or components may be exaggerated for clarity.

In the description of the present invention that follows, certain terms are employed to refer to the positional relationship of certain structures relative to other structures. As used herein the term "forward" and derivatives thereof refer to the general direction the gas mixture travels as it moves through the hyperpolarizer unit; this term is meant to be synonymous with the term "downstream" which is often used in manufacturing environments to indicate that certain material being acted upon is farther along in the manufacturing process than other material. Conversely, the terms "rearward" and "upstream" and derivatives thereof refer to the directions opposite, respectively, the forward and downstream directions. Also, as described herein, polarized gases are collected, frozen, thawed, and used in MRI applications. For ease of description, the term "frozen polarized gas" means that the polarized gas has been frozen into a solid state. The term "liquid polarized gas" means that the polarized gas has been or is being liquefied into a liquid state. Thus, although each term includes the word "gas," this word is used to name and descriptively track the gas which is produced via a hyperpolarizer to obtain a polarized "gas" product. Thus, as used herein, the term "gas" has been used in certain places to descriptively indicate a hyperpolarized noble gas product and may be used with modifiers such as solid, frozen, and liquid to describe the state or phase of that product.

Various techniques have been employed to accumulate and capture polarized gases. For example, U.S. Pat. No. 5,642,625 to Cates et al. describes a high volume hyperpolarizer for spin polarized noble gas and U.S. Pat. No. 5,809,801 to Cates et al. describes a cryogenic accumulator for spin-polarized $^{129}$Xe. These patents are hereby incorporated by reference as if recited in full herein. As used herein, the terms "hyperpolarize," "polarize," and the like, mean to artificially enhance the polarization of certain noble gas nuclei over the natural or equilibrium levels. Such an increase is desirable because it allows stronger imaging signals corresponding to better MRI images of the substance and a targeted area of the body. As is known by those of skill in the art, hyperpolarization can be induced by spin-exchange with an optically pumped alkali-metal vapor or alternatively by metastability exchange. See Albert et al., U.S. Pat. No. 5,545,396.

Referring to the drawings, FIG. 1 illustrates a preferred hyperpolarizer unit 10. This is a high-volume unit which is configured to produce and accumulate spin-polarized noble gases substantially continually, i.e., the flow of gas through the optical cell is substantially continuous during accumulation. As shown, the unit 10 includes a noble gas mixture supply 12 and a supply regulator 14. A purifier 16 is positioned in the line to remove impurities such as water vapor from the system as will be discussed further below. The hyperpolarizer unit 10 also includes a flow meter 18 and an inlet valve 20 positioned upstream of a polarizer or optical cell 22. An optic light source such as a laser 26 (preferably a diode laser array) is directed into the polarizer cell 22 through various focusing and light distributing means 24, such as lenses, mirrors, and the like. The laser 26 is circularly polarized to optically pump alkali metals in the cell 22. The cell 22 is positioned inside a temperature-regulated oven (schematically illustrated by a double dotted line) 122. An additional valve 28 is positioned downstream of the polarizer cell 22.

Next in line, as shown in FIG. 1, is a cold finger or accumulator 30. The accumulator 30 is connected to the hyperpolarizer unit 10 by a pair of releasable mechanisms such as threaded members or quick disconnects 31, 32. This allows the accumulator 30 to be easily detached, removed, or added, to and from the system 10. The accumulator 30 is operably associated with a cold source or refrigeration means 42. Preferably, and as shown, the cold source 42 is a liquid cryogen bath 43. The accumulator 30 will be discussed in more detail hereinbelow.

Figure 9:
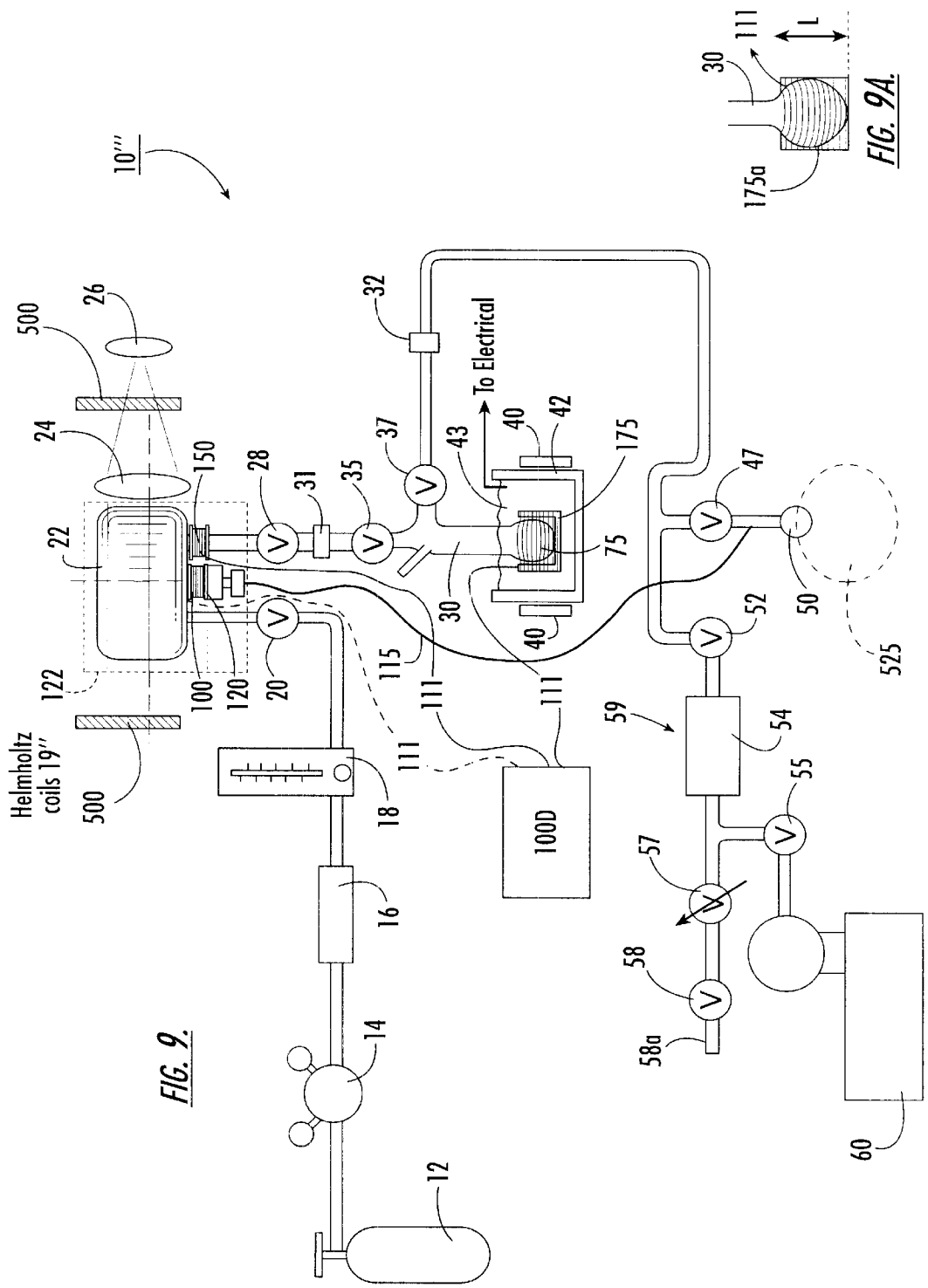
FIG. 9 is a schematic illustration of an additional embodiment of a hyperpolarizer according to the present invention illustrating a cryogenically positioned NMR excitation coil.

As shown in FIGS. 1 and 9, the hyperpolarizer 10 also includes a vacuum pump 60 is in communications with the system. Additional valves to control flow and direct exit gas are shown at various points (shown as 52, 55). A shut-off valve 47 is positioned adjacent an "on-board" exit gas tap 50. Certain of the valves downstream of the accumulator 30 are used for "on-board" thawing and delivery of the collected polarized gas as will be described further below. A preferred accumulator or "coldfinger" is described in co-pending and co-assigned U.S. application Ser. No. 08/989,604 to Driehuys et al, the contents of which is hereby incorporated by reference as if recited in its entirety herein.

The unit 10 also includes a digital pressure transducer 54 and flow control means 57 along with a shut-off valve 58. The shut-off valve 58 preferably controls the flow of gas through the entire unit 10; it is used to turn the gas flow on and off, as will be described below. As will be understood by those of skill in the art, other flow control mechanisms, and devices (analog and electronic) may be used within the scope of the present invention.

In operation, a gas mixture is introduced into the unit 10 at the gas source 12. As shown in FIG. 1, the source 12 is a pressurized gas tank which holds a premixed gas mixture. Generally described, for spin-exchange optically pumped systems, a gas mixture is introduced into the hyperpolarizer apparatus upstream of the polarizer cell 22. Most xenon gas mixtures include a buffer gas as well as a lean amount of the gas targeted for hyperpolarization and are preferably produced in a continuous flow system. For example, for producing hyperpolarized $^{129}$Xe, the premixed gas mixture is about 85–98% He (preferably about 85–89% He), about 5% or less $^{129}$Xe, and about 1–10% $N_2$ (preferably about 6–10%). In contrast, for producing hyperpolarized $^3$He, a typical mixture of about 99.25% $^3$He and 0.75% $N_2$ is pressurized to 8 atm or more and heated and exposed to the optical laser light source, typically in a batch mode system. In any event, once the hyperpolarized gas exits the polarizer cell (i.e., the pumping chamber) 22, it is directed to a collection or accumulation container.

Thus, as described above, in a preferred embodiment, the pre-mixed gas mixture includes a lean noble gas (the gas to be hyperpolarized) and buffer gas mixture. The gas mixture is passed through the purifier 16 and introduced into the polarizer cell 22. The valves 20, 28 are on/off valves operably associated with the polarizer cell 22. The gas regulator 14 preferably steps down the pressure from the gas tank source 12 (typically operating at 2000 psi or 136 atm) to about 6–10 atm for the system. Thus, during accumulation, the entire manifold (conduit, polarized cell, accumulator, etc.) is pressurized to the cell pressure (about 6–10 atm). The flow in the unit 10 is activated by opening valve 58 and is controlled by adjusting the flow control means 57.

The typical residence time of the gas in the cell 22 is about 10–30 seconds; i.e., it takes on the order of 10–30 seconds for the gas mixture to be hyperpolarized while moving through the cell 22. The gas mixture is preferably introduced into the cell 22 at a pressure of about 6–10 atm. Of course, as is known to those of skill in the art, with hardware capable of operating at increased pressures, operating pressures of above 10 atm, such as about 20–30 atm, are preferred to pressure broaden the alkali metal (such as rubidium ("Rb")) and facilitate the absorption of (approaching up to 100%) of the optical light. In contrast, for laser linewidths less than conventional linewidths, lower pressures can be employed. The polarizer cell 22 is a high pressure optical pumping cell housed in a heated chamber with apertures configured to allow entry of the laser emitted light. Preferably, the hyperpolarizer unit 10 hyperpolarizes a selected noble gas such as $^{129}$Xe (or $^3$He) via a conventional spin-exchange process. A vaporized alkali metal such as Rb is introduced into the polarizer cell 22. The Rb vapor is optically pumped via an optic light source 26, preferably a diode laser.

The unit 10 employs helium buffer gas to pressure broaden the Rb vapor absorption bandwidth. The selection of a buffer gas is important because the buffer gas—while broadening the absorption bandwidth—can also undesirably impact the alkali metal-noble gas spin-exchange by potentially introducing an angular momentum loss of the alkali metal to the buffer gas rather than to the noble gas as desired. In a preferred embodiment, $^{129}$Xe is hyperpolarized through spin exchange with the optically pumped Rb vapor. It is also preferred that the unit 10 use a helium buffer gas with a pressure many times greater than the $^{129}$Xe pressure for pressure broadening in a manner which minimizes Rb spin destruction.

As will be appreciated by those of skill in the art, Rb is reactive with $H_2O$. Therefore, any water or water vapor introduced into the polarizer cell 22 can cause the Rb to lose laser absorption and decrease the amount or efficiency of the spinexchange in the polarizer cell 22. Thus, as an additional precaution, an extra filter or purifier (not shown) can be positioned before the inlet of the polarizer cell 22 with extra surface area to remove even additional amounts of this undesirable impurity in order to further increase the efficiency of the polarizer.

Hyperpolarized gas, together with the buffer gas mixture, exits the polarizer cell 22 and enters a collection reservoir 75 located at the bottom of the accumulator 30. In operation, at the lower portion of the accumulator 30, the hyperpolarized gas is exposed to temperatures below its freezing point and collected as a frozen product 100 in the reservoir 75. The hyperpolarized gas is collected (as well as stored, transported, and preferably thawed) in the presence of a magnetic field, generally on the order of at least 500 Gauss, and typically about 2 kilo Gauss, although higher fields can be used. Lower fields can potentially undesirably increase the relaxation rate or decrease the relaxation time of the polarized gas. As shown in FIG. 1, the magnetic field is provided by permanent magnets 40 positioned in the cryogen bath and arranged about a magnetic yoke 41.

The hyperpolarizer unit 10 can also capitalize on the temperature change in the outlet line between the heated pumping cell 22 and the refrigerated cold trap or accumulator 30 to precipitate the alkali metal from the polarized gas stream in the conduit above the accumulator 30. As will be appreciated by one of skill in the art, the alkali metal can precipitate out of the gas stream at temperatures of about 40° C. The unit 10 can also include an alkali metal reflux condenser (not shown) or post-cell filter (not shown). The refluxing condenser employs a vertical refluxing outlet pipe which is kept at room temperature. The gas flow velocity through the refluxing pipe and the size of the refluxing outlet pipe is such that the alkali metal vapor condenses and drips back into the pumping cell by gravitational force. Alternatively, a Rb filter can be used to remove excess Rb from the hyperpolarized gas prior to collection or accumulation. In any event, it is desirable to remove alkali metal prior to delivering polarized gas to a patient to provide a non-toxic, sterile, or pharmaceutically acceptable substance (i.e., one that is suitable for in vivo administration).

Once a desired amount of hyperpolarized gas has been collected in the accumulator 30, the accumulator 30 can be detached or isolated from the unit 10. In a preferred embodiment, valve 28 is closed, leaving the cell 22 pressurized. This allows the accumulator 30 and the downstream plumbing to begin to depressurize because the flow valve 58 is open. Preferably, the portion of the unit 10 downstream of the valve 28 is allowed to depressurize to about 1.5 atm before the flow valve 58 is closed. After closing the flow valve 58, valve 55 can be opened to evacuate the remaining gas in the manifold. Once the outlet plumbing is evacuated, valves 35 and 37 are closed. If the collected gas is to be distributed "on-board," i.e., without removing the accumulator 30 from the unit 10, a receptacle such as a bag 525 or other vessel as shown in FIG. 9, can be attached to the outlet 50. The valve 47 can be opened to evacuate the attached bag. Once the bag 525 is evacuated and the gas is 30 ready to thaw, valve 52 can be optionally closed. This minimizes the contact of the polarized gas with the pressure transducer region 59 of the unit 10. This region can include materials that have a depolarizing effect on the polarized gas. Thus, long contact times with this region may promote relaxation of the polarized gas.

If the valve 52 is not closed, then valve 55 is preferably closed to prevent the evacuation of polarized thawed gases. It is also preferred that the flow channels on the downstream side of the cell 22 (including the secondary reservoir and bleed line discussed below) are formed from materials which minimize the contact-induced depolarization effect on the polarized state of the gas. Coatings can also be used such as those described in U.S. Pat. No. 5,612,103, the disclosure of which is hereby incorporated by reference as if recited in full herein. Other suitable materials are described in co-pending and co-assigned U.S. patent application Ser. No. 09/126,448 to Deaton et al. The content of this application is also incorporated by reference as if recited in full herein. In the "on-board" thaw operation, valve 37 is opened to let the gas out. It then proceeds through valve 47 and out outlet 50.

In the "detached" or "transported accumulator" thaw mode, accumulator first and second isolation valves 35, 37 are closed after the depressurization and evacuation of the accumulator 30. Evacuating the accumulator 30 allows any residual gas in the accumulator 30 to be removed. Leaving gas in the accumulator 30 with the frozen polarized gas may contribute to the heat load on the frozen gas, possibly raising the temperature of the frozen gas and potentially shortening the relaxation time. Thus, in a preferred embodiment, after depressurization and evacuation and closing the isolation valves 35, 37, the accumulator 30 is disconnected from the unit 10 via release points 31, 32.

The isolation valves 35, 37 are in communication with the primary flow channel 80 and the buffer gas exit channel 90 respectively and each can adjust the amount of flow therethrough as well as close the respective paths to isolate the accumulator from the unit 10 and the environment. After the filled accumulator 30 is removed, another accumulator 30 can be easily and relatively quickly attached to the release points 31, 32. Preferably, when attaching the new accumulator 30, the outlet manifold is evacuated using valve 55 (with valves 52, 35, 37 open). When a suitable vacuum is achieved (such as about 100 mm Torr) which typically occurs within about one minute or so, valve 55 is closed. Valve 28 is then re-opened which repressurizes he outlet manifold to the operating cell pressure. Valve 58 is then opened to resume flow in the unit 10. Preferably, once flow resumes, liquid nitrogen is applied to the accumulator 30 to continue collection of the hyperpolarized gas. Typically such a changeover takes on the order of less than about five minutes. Thus, a preferred hyperpolarizer unit 10 is configured to provide a continuous flow of hyperpolarized $^{129}$Xe gas for continuous production and accumulation of same.

On-board Post-optical Cell Polarization Monitor

In prior polarization units, typically a NMR excitation coil was positioned in the oven 122 adjacent the optical cell 22 (also in the oven) to determine the polarization level achieved by the gas in the cell 22. Further, at least one laboratory has also used a small sealable (about 5 cc) glass bulb which was filled with a sample of hyperpolarized gas at the same point as the collection vessel or dose bag. The small bulb was then taken to a separate 4.7 T spectrometer to determine the level of polarization associated with the collection vessel.

The present invention now conveniently provides for an on-board (on the hyperpolarizer unit 10) polarization level measurement associated with the polarized gas at various points in the production cycle, such as at both at the polarizer cell 22 and one or more pre-dispensing and post-thaw gas production point(s). As shown in FIG. 1, in a preferred embodiment, the (post-thaw) gas exit path 113 (the gas exit path illustrated in dotted line) starts at the cold finger accumulator 30, extends down the exit line 113a to valve 47 and then to dispensing outlet line 114. The dispensing-outlet line 114 ends at the xenon outlet 50. A small bleed line 115 is in fluid communication with the xenon outlet 50. Preferably, as shown in FIG. 1, the bleed line 115 is connected to the dispensing outlet line 114 a distance above the xenon outlet 50. However, the bleed line 115 can be alternatively positioned along the exit line 113a, but is preferably positioned adjacent the dispensing outlet 50 to provide a more reliable indication of the polarized state of the gas at the outlet 50. The bleed line 115 is in fluid communication with the dispensing outlet line 114 and defines a secondary flow path for the hyperpolarized gas, the bleed line 115 being configured and sized to direct a small quantity of the hyperpolarized gas to the secondary reservoir 120.

In a preferred embodiment, a quantity of hyperpolarized gas is cryogenically accumulated as described above to collect a quantity of hyperpolarized $^{129}$Xe in frozen or ice form. Valves 35 and 37 are closed. The frozen hyperpolarized $^{129}$Xe gas is then warmed, preferably by applying heat and increasing the pressure in the accumulator 30 such that the solid transitions substantially directly to liquid phase. Typically, after about an eight second delay from the time of heat application, the xenon isolation valve 52 is closed and the accumulator 30 is opened via valve 37 to allow the post thaw gas to enter the exit line 113 through gate 32. The hyperpolarized gas then flows through valve 47 into the dispensing outlet line 114 and a majority of the gas is directed to a collection vessel at the xenon outlet 50. During this portion of the production cycle, valve 52 can remain open, but it is preferred that valve 55 be closed for pressure monitoring.

Recently, the hyperpolarizer unit 10 has been reconfigured to operate with potentially even more reliable thaws according to one aspect of the present invention. As discussed above, previous thaw methods have provided increased post-thaw polarization levels. Referring to FIG. 9, in this previous method, both cold finger valves 35, 37 were closed and a waiting period (typically set at about 8 seconds) was employed before one or more of the valves 35, 37 were opened to release the gas, thus increasing the internal pressure in the cold finger 30 during the critical thaw phase before releasing the thawed gas. See also co-pending and co-assigned U.S. patent application Ser. No. 08/989,604 to Driehuys et al. However, it has been discovered that the "optimal" hold time or waiting period can vary depending on the quantity of gas accumulated, the flow rate used during accumulation, and the like. Therefore, in order to increase reliable post-thaw polarization, it is preferred that the hyperpolarizer unit 10 is configured to monitor the pressure of the gas in the (downstream) plumbing associated with the cold finger 30 and then to release the thawed gas at a predetermined pressure rather than at a preset time. In addition, it is preferred that the hyperpolarizer unit 10 is configured to minimize the dead volumes in the plumbing between valve 37 and valve 52 as well as the pressure transducer dead volume (52–54).

In operation, the thaw method is performed with cold finger valve 37 open, the valve 47 still closed, the valve 52 open, and the valves 55 and 58 still closed. This configuration adds a small dead volume of about 7.3 cc's to the cold finger 30, the internal volume of which is typically about 22 cc's. Thus, the thaw speed itself is generally not adversely affected by the configuration change, but the pressure monitoring now provided allows a more predictable and repeatable opening of the valve associated with the control of the gas exiting the cold finger 30 (now valve 47). That is, during thaw, a major portion of the hyperpolarized gas transitions directly from a frozen solid into a liquid phase corresponding to the pressure in the cold finger during the thawing step. Preferably, the predetermined release pressure is set at about at least 1 atmosphere. Opening the valve after the pressure reaches 1 atm has shown improved xenon post thaw release for 100–600 cc's of accumulated $^{129}$Xe. Interestingly, lowering the release pressure (such as to 0.8 atm) can introduce unreliable post-thaw polarization levels and slow the rate at which the polarized gas exits the cold finger.

Although polarized thawed $^{129}$Xe is directed into the dead volume in a post-thaw path (the path downstream of valve 47 and between valves 52–55–58) and may depolarize therein, the rapid release of the thawed polarized gas once valve 47 is opened is such that little of the depolarized gas enters into the exit path 114, 114a (i.e., once valve 47 opens, substantially all of the thawed gas flows into the path defined between valves 37–47–50). In any event, even if depolarized gas in the dead volumes mix with the primary polarized thaw gas, it is a relatively small volume compared to the typical collection volumes that the overall polarization is minimally reduced. Preferably, as will be appreciated by those of skill in the art, other pressure monitoring sensors and plumbing configurations can also be employed, in which the pressure monitor and plumbing are configured to minimize the dead volume experienced by the hyperpolarized gas during the thaw phase of the process.

In any event, as the hyperpolarized gas flows in the exit line 114, the gas exit flow path includes both a primary flow path 114a which directs the gas toward the filling point 50, and a secondary flow path along the bleed line 115. As such, a small amount of the hyperpolarized gas is diverted away from the primary flow path 114 into the secondary flow path formed by the bleed line 115 and the secondary reservoir 120. Preferably, the secondary reservoir 120 is sized and configured such that it has a minimal volume, i.e., a quantity sufficient to determine a reliable polarization level which does not substantially deplete the useable volume of hyperpolarized gas. In one preferred embodiment, the secondary reservoir 120 has an internal free space volume of about 2 cc. Similarly, the bleed line 115 is configured and sized to have a minimal volume along its length such as ¼ inch outer diameter tubing typically having about a 3–4 cc. inner volume along its length. As such, in a preferred embodiment, the secondary flow path polarization measurement uses only about 6 cc. of gas, a relatively insubstantial volume compared to the typical 1 liter volume of gas collected at the exit 50.

In a preferred embodiment, as shown in FIG. 1, a dual symmetry NMR coil 100 is positioned such that one surface contacts the polarizer cell 22 while the other contacts the secondary reservoir 120. A magnetic field operably associated with the optical cell 22 (typically provided by a pair of Helmholtz coils such as those schematically shown in FIG. 9 at element 500) has a region of homogeneity defined thereby. Preferably, the region of homogeneity envelops a major portion of the polarizer cell 22, the NMR coil 100, and at least a top portion of the secondary reservoir 120a, i.e., the portion of the secondary reservoir 120 adjacent the NMR coil 100. A typical region of homogeneity is schematically illustrated by the dotted line box designated $B_0$ in FIG. 1. Preferably, the homogeneity is sufficient in the measurement region to allow a reliable reading of the hyperpolarized gas, as magnetic field gradients can act to depolarize the diverted gas (i.e., the hyperpolarized gas in the secondary reservoir 120), potentially introducing inaccurate measurement representation of the post-thaw polarization.

Preferably, for effective polarimetry measurements, it is preferred that the $T_2$* value be in excess of about 5 ms (the typical mute time after the pulse is transmitted is about 3 ms). This means that for a hyperpolarizer unit 10 with a magnetic field generated by "on-board" 19 inch diameter Helmholtz coils 500, the coils are positioned and configured to generate a region of homogeneity which is defined by a virtual cylinder having a length of about 2 inches and a radius of about 2 inches centered between the coils 500. The polarizer or optical cell 22, an example of which is shown in FIG. 9, thus has a corresponding configuration and volume which is designed to substantially fit within the region of homogeneity. In addition, the magnet means is configured to extend the region of homogeneity such that it is sufficient to include the dimensions of the dual symmetry coil 100 and at least the closed end of the secondary reservoir 120. For example, a polarizer cell 22 with a radius of about 0.75 inches, a NMR dual symmetry monitoring coil 100 of about 0.375 inches, and the secondary reservoir 120 of about 0.5 inches would be suitable (1.625 inches).

Figure 6:
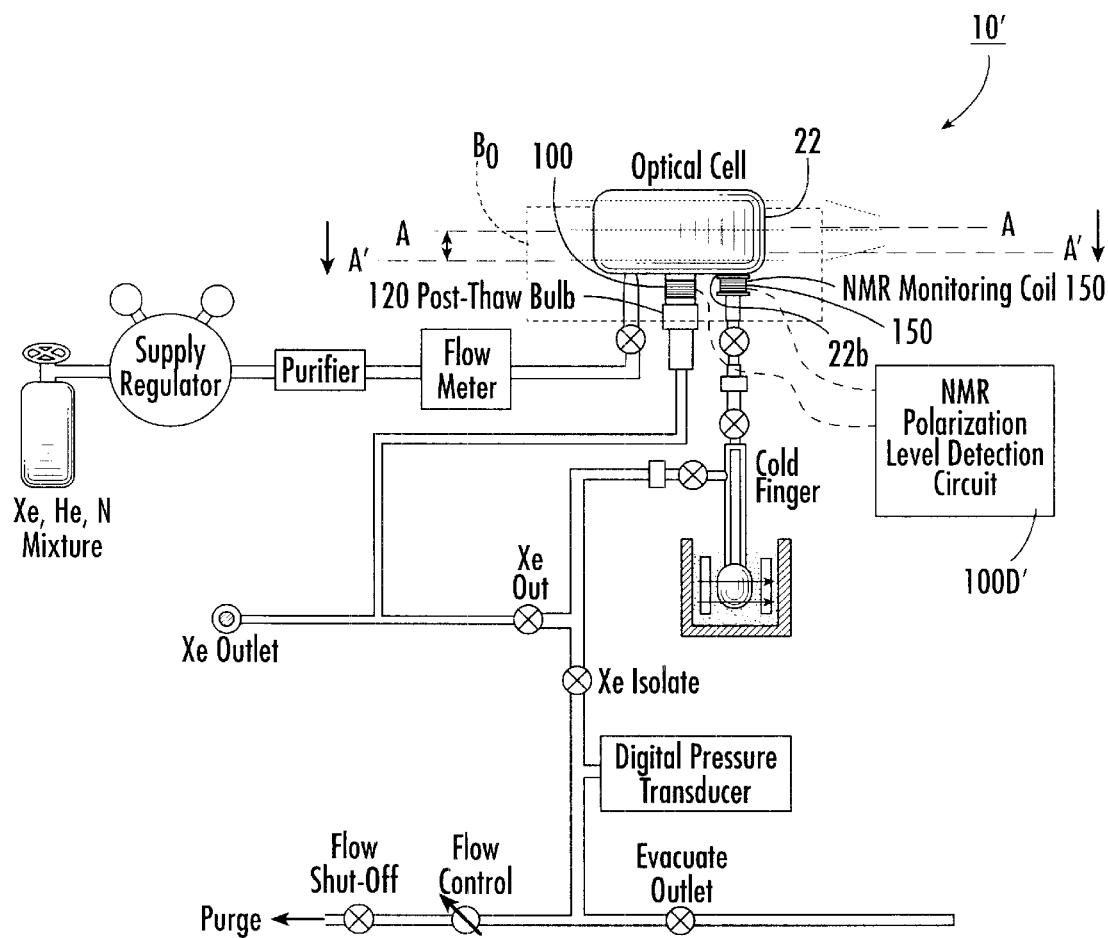
FIG. 6 is a schematic illustration of an alternate embodiment of a hyperpolarizer with multiple in process polarization monitoring points according to the present invention.

In one embodiment, as shown in FIG. 6, the center of the magnetic field generated by the Helmholtz coils 500 is shifted to be offset relative to the center of the optical cell 22. This offset is schematically shown by a first magnetic field central axis along the line A—A to a second axis shifted closer to the NMR coil 100 indicated by the axis line A'—A'. The offset can facilitate the configuration of the magnetic field is sufficiently homogeneous in the region associated with the NMR coil 100 and/or the NMR coil 150 for more sensitive monitoring of the polarization of the gas thereat.

Of course, the secondary reservoir 120 and associated NMR coil and operating circuitry (together a NMR coil and related pulse measurement operating circuitry, when positioned after the polarizer cell 22 can be described as a "post-optical cell monitoring system") can operate for non-cryogenic accumulation systems as well. For example, subsequent to the optical pumping of the gas, such as during fill, a small portion of a hyperpolarized gas can be directed away from the gas flow path into the secondary reservoir 120 to indicate the degree of polarization at the filling point in the a production cycle (such as when filling $^3$He via a fill port (not shown) into a portable container). Alternately, a secondary flow path can be provided at other critical or desired monitoring points in the production cycle.

Figure 5:
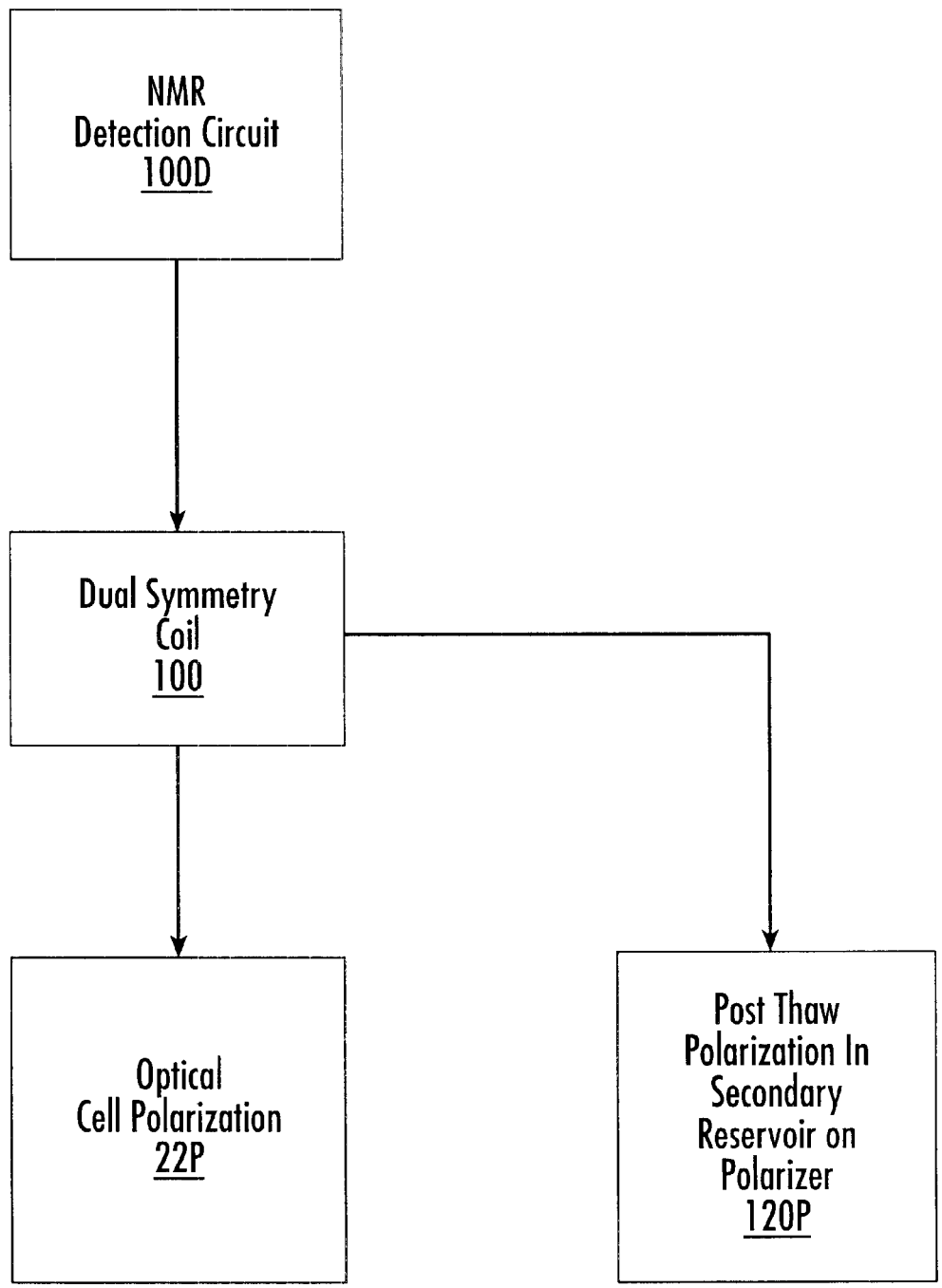
FIG. 5 is a schematic diagram for an operational relationship of an electrical monitoring circuit according to the present invention.
Figure 8:
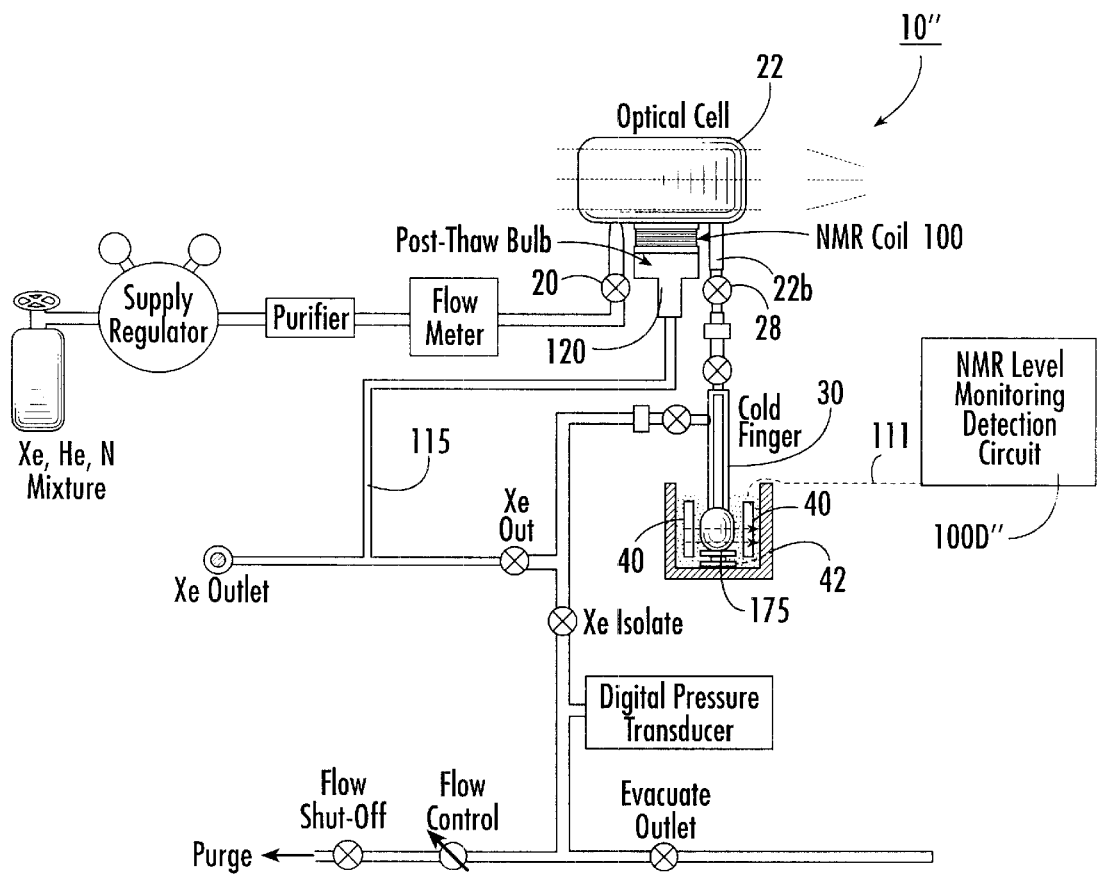
FIG. 8 is a schematic illustration of yet another embodiment of a hyperpolarizer with multi-point monitoring according to the present invention.

In a preferred embodiment, as shown in FIG. 8, the secondary reservoir 120 is positioned adjacent the dual symmetry NMR coil 100 which is positioned adjacent the polarizer cell 22 in the oven 122 such that it can monitor the polarization of the hyperpolarized gas both in the cell 22 and in a secondary reservoir (or post-thaw bulb) 120. That is, the NMR coil 100 is sandwiched between the polarizer cell 22 on one side and the secondary reservoir 120 on the other. As such, the secondary reservoir 120 is preferably positioned in the oven 122 alongside the bottom of the optical cell 22. The NMR coil lead 111 (such as lead 106 shown in FIG. 2B) are configured to exit the bottom of the oven 122 and then electrically connect with a detection circuit circuit 100D (FIG. 5). In operation, when activating the secondary reservoir 120, it is preferred that the oven temperature be known and controlled because at high temperatures the gas density of xenon will be reduced according to the relationship expressed by the ideal gas law (PV=nRT). For example, if the oven 122 is set at 150° C., the density of xenon in the secondary reservoir 120 is about (295K/423K or 0.70) of the room temperature density. The signal associated with the hyperpolarized gas in the secondary reservoir 120 is reduced correspondingly. Therefore, the signal data can be corrected for known oven 122 temperature values to reflect a representative room temperature reading.

Figure 2A:
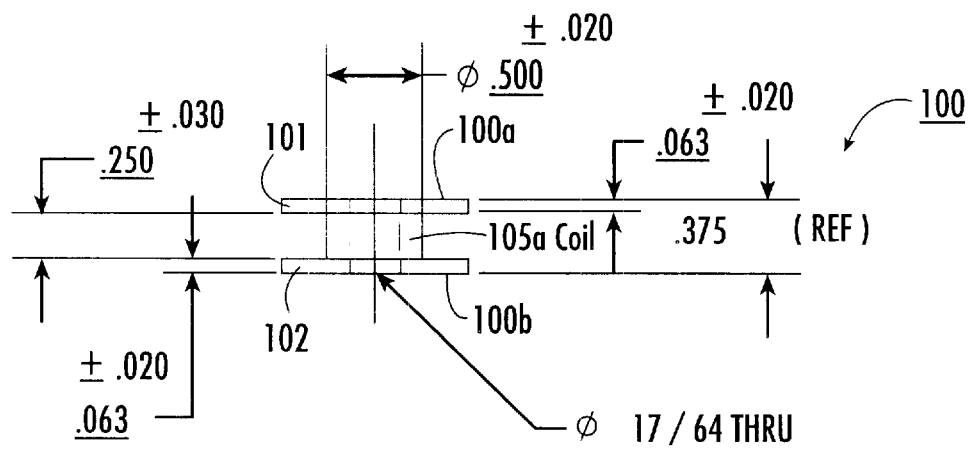
FIG. 2A is a side view of a dual symmetry NMR coil according to the present invention.
Figure 2B:
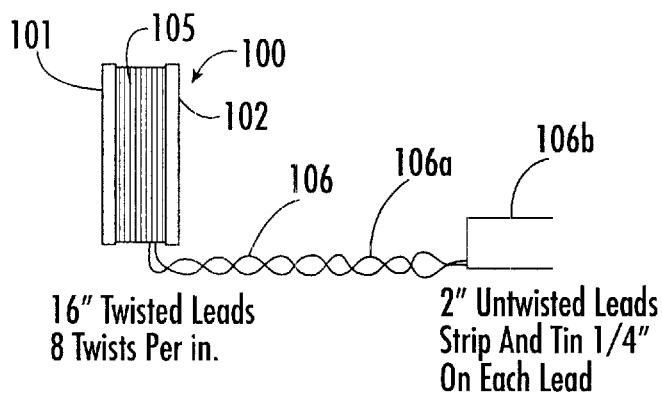
FIG. 2B is a side view of the NMR coil of FIG. 2A schematically illustrating the electrical wire wrapped around and positioned onto the NMR coil body.
Figure 2C:
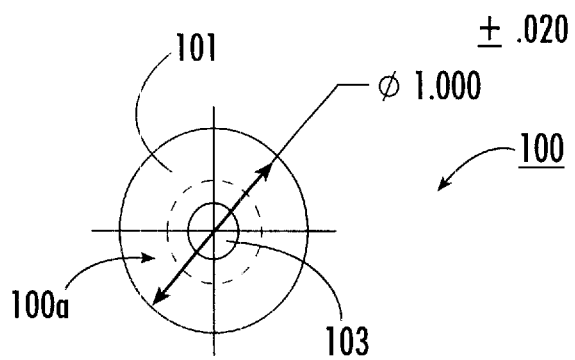
FIG. 2C is a top view of FIG. 2A.

FIGS. 2A and 2B illustrate a preferred embodiment of a dual symmetry NMR coil 100. In a preferred embodiment, as shown in FIG. 2A, the body of the NMR coil 100 includes opposing first and second flange portions 101, 102 and a center coil-receiving portion 105a. The body is preferably formed of a nonconducting material such as FLUOROSINT 500. Conducting coil 105 is wrapped onto the center coil-receiving portion 105a of the coil body. Preferably, about 350 turns of 30 AWG (copper) wire is wrapped along the center coil-receiving portion 105a. The conducting coil 105 wire turns can be secured onto the NMR coil body center coil-receiving portion 105a such as with ¼ inch glass tape. It is also preferred that the wire forming the conducting coil 105 be selected to have about a 200° C. continuous service rating. This will allow the winding to withstand the operating temperatures inside the oven 122 (typically about 160–200° C.). As shown in FIG. 2B, the NMR coil 100 also includes a length of wire 106 extending from the coil 100 to connect it to a NMR polarization detection circuit 100D (FIG. 5). A first major portion of this wire length 106 is preferably formed as a set leads having a major twisted portion 106A having a twist configuration of about 8 twists per inch and extending with an associated length of about 16 inches. As is also shown in FIG. 2B, a minor portion 106B of the two leads 106 is untwisted. Preferably the minor portion is about two inches in length (less than about 20% of the twisted length). In a preferred embodiment, the untwisted portion 106B of the leads 106 are stripped and plated with a conductive metal plating such as tin. The NMR coil 100 is preferably configured such that the coil spool center receiving portion 105a has about a 0.5 inch (1.27 cm) diameter with the coil layers winding out the coil 105 to about a 0.85 inch (and typically under 1.0 inches) diameter. In a preferred embodiment, the NMR coil 100 is configured to provide a DC resistance of about 7.0±1.0Ω and an inductance of about 2.1±0.2 mH. Typically, the NMR coil 100 is tuned to resonate at about 25 kHz which corresponds to a fixed capacitor of about 20,000 pF. This yields a Q value of about 20.

The first and second flange portions 101, 102 have "dual symmetry" with respect to the center coil portion 105a (i.e., they are sized and configured the same). Advantageously, the dual symmetry configuration of the NMR coil 100 allows the same NMR coil 100 and the same NMR polarization detection circuit 100D to be used to measure the polarization of the gas at two different points in the production cycle, i.e., at two different locations in the hyperpolarizer unit 10; at the polarizer cell 22 and at the secondary reservoir 120 associated with the gas proximate to the dispensing outlet 50. As such, in operation, in a preferred embodiment, an upper exposed planar perimeter surface 100a of the first flange portion 101 is positioned to contact the optical cell and the lower exposed perimeter surface 100b of the second flange portion 102 is positioned to contact the secondary reservoir 120.

In a preferred embodiment, the two flange portions 101, 102 have a relatively small or thin width of less than about 0.1 inches (2.54 mm), and more preferably of less than about 0.063 inches (1.6 mm). This small or thin symmetrical flange portion configuration can allow the coil conductive portion 105 to be positioned closer to the hyperpolarized gas on both flange sides 101, 102 of the NMR coil 100. The NMR coil 100 is about 0.250 inches in height (about 0.63 cm). As shown, the NMR coil 100 also includes a center aperture 103 formed therethrough. Alternatively, the aperture 103 can be filled or the body formed as a solid non-conductive material in this volume.

FIG. 3 illustrates a preferred embodiment of a secondary reservoir 120 (also descriptively called a post-thaw bulb for cryogenic accumulator applications). As shown, the secondary reservoir 120 includes an enclosed end portion 121 which is configured to capture the hyperpolarized gas therein. In position on the hyperpolarizer unit 10, as shown in FIG. 1, the enclosed end portion 121 is positioned to face the adjacently contacting surface of the NMR coil 101b. The enclosed end 121 is preferably configured with a thin wall face portion, i.e., the portion which is configured to contact the NMR coil 100. Preferably, the enclosed end 121 is formed of PYREX which is about 1–2 mm thick. Of course, the gas contacting surfaces of the secondary reservoir 120 (and/or associated lines or plumbing) can be coated with surface-relaxation resistant materials or formed from different materials (such as high purity polymers as described in U.S. patent application Ser. No. 09/126,448 to Deaton et al.) to increase $T_1$. Metal film surfaces may also be used but care should be taken that they be configured sufficiently thin to preclude signal degradation/strength.

FIG. 3 illustrates the enclosed end portion 121 as a substantially planar face and is preferably configured to rest against the bottom of the NMR coil 100. However, it will be appreciated by one of skill in the art that the present invention is not limited thereto. For example, FIG. 3A illustrates an alternative configuration for the secondary reservoir 120' which configures the enclosed end 121P with a circumferentially positioned upstanding ridge 121P. This ridge is configured and sized to receive the outer diameter of the bottom flange of the NMR coil 100 therein. This configuration can provide easy alignment with the coil 100. Precise alignment and reliably repeatable positioning of the NMR coil 100 can improve the accuracy and reproducibility of the calibration across multiple hyperpolarizers during increased production builds and can also facilitate a more repeatable replacement of the coil in the field.

The secondary reservoir 120 also includes a second end 122 which is configured to attach to the plumbing of the hyperpolarizer unit 10 along the bleed path 115. The secondary reservoir 120 also includes a longitudinally extending central portion. The secondary reservoir 120 includes a passage 124 which defines a free volume of about 3–4 cubic centimeters and which is open to allow gas to flow through to the enclosed end 121 thereof. As the bleed line 115 and the secondary reservoir 120 have hyperpolarized gas contacting surfaces, it is preferred that they be configured to minimize contact induced depolarization, i.e., the walls and valves. O-rings and the like are formed of polarization friendly materials or coatings. See U.S. Pat. No. 5,612,103 to Driehuys et. al.; see also co-pending and co-assigned U.S. patent application Ser. No. 09/126,448. The disclosures of which are hereby incorporated by reference as if recited in full herein. In a preferred embodiment, the secondary reservoir 120 is configured with a body which has a surface induced contact relaxation which is longer than about 10 seconds, more preferably longer than about 30 seconds, and most preferably longer than about 2.0 minutes, to allow sufficient time to collect a NMR signal and obtain a polarization reading.

FIG. 4 illustrates a perspective view of a plumbing diagram for a preferred embodiment of a hyperpolarizer unit 10 according to the present invention. As shown, the NMR coil 100 is positioned adjacent a laterally intermediate bottom portion of the polarizer cell 22 (but can, of course, be alternatively positioned as long as it is within a suitably homogeneous magnetic field). The NMR coil 100 is positioned intermediate the polarizer cell 22 on one end and the secondary reservoir cell 120 on the other.

FIG. 5 illustrates an electrical block diagram layout for a preferred on-board polarization monitoring embodiment for the NMR coil 100 of the present invention. As shown, a single unitary NMR detection circuit 100D can be employed to monitor the polarization level of the gas via the NMR coil 100 during the production cycle, namely, the polarization level at the optical (polarizer) cell 22P and the polarization level of the polarized gas at the secondary reservoir 120P. This configuration allows the same NMR coil, the same circuit and cables to monitor two gas locations. This dedicated circuit 100D can eliminate the switching of cables and pulse parameter adjustments needed for operation. For additional NMR coils positioned in alternate locations along the production path, such as in a post-accumulation region, a pre-dispensing region, or at a position along the exit flow path 113P in the hyperpolarizer unit 10, one can physically or electrically switch cables or other operational circuitry to look at the desired position (shown for example in FIG. 14 as 302S). For example, in the case of the solid $^{129}$Xe (frozen), a different NMR circuit may be used to drive a higher frequency excitation pulse as will be discussed further below.

Conventionally, as shown in the bottom graph of FIG. 13, NMR uses heterodyning or homodyning techniques to mix the received signal with a carrier of similar frequency. In operation, these techniques give a sum and difference frequency as will be appreciated by those of skill in the art. However, unless a quadrature (2 channel) detection scheme is used and the signal is Fourier Transformed (FT) before analysis, inaccurate signal measurements can result, especially at low difference frequencies. Low difference frequencies are typically necessary to stay within the bandwidth of the coil response and to pulse the nulcei near their resonant frequency. This can be problematic when attempting to analyze the signal and calculate the polarization.

Figure 14:
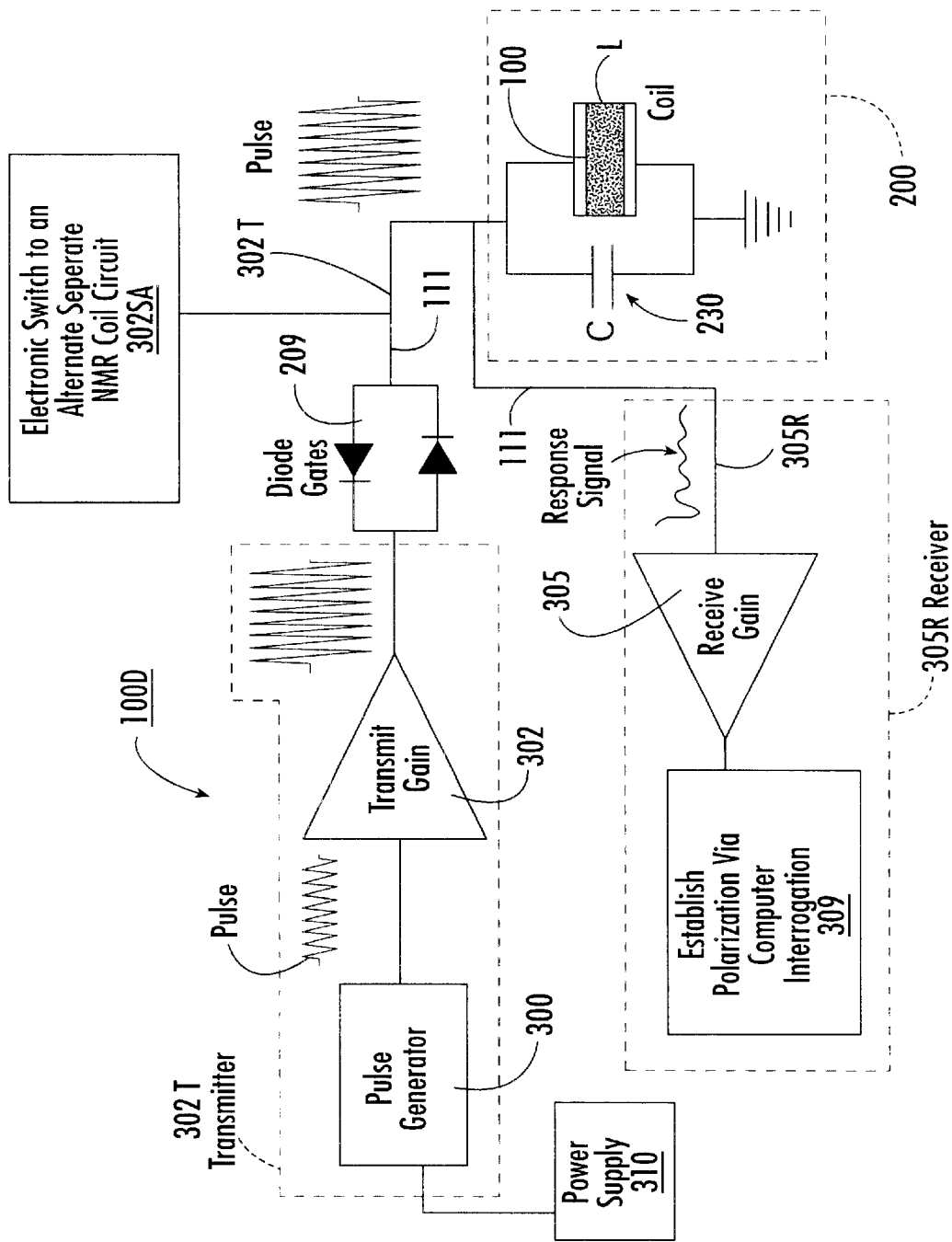
FIG. 14 is a schematic illustration of a prior art NMR polarization level detection circuit modified to add a circuit switching means to monitor additional points in the production cycle according to the present invention.

FIG. 14 illustrates a suitable prior art NMR detection circuit 100D which has been modified to add a circuit switching means 302S. Generally described, the NMR detection circuit 100D uses a low field spectrometer or transmitter 302T which comprises a power supply 310, a pulse generator 300, and a transmit amplifier 302. A transmit/receive line (111) connects the coil 100 to both the transmitter 302T and a receiver 305R. The receiver 305R shown includes a receive amplifier 305 and computer 309 and can also include a filter 307. As is also shown, the NMR detection circuit 100D also preferably includes diode gates 209 to direct the signal from the transmitter to the coil 100 or from the coil 100 to the receiver portion of the circuit 100D according to the operational mode of the NMR detection circuit. In one embodiment, the circuit 100D can employ a simple receiver analyzer which includes a peak-to-peak detector which translates the peak detection into a polarization level and a simple display or oscilloscope output (it does not require a computer to evaluate or measure the polarization).

Preferably, the NMR detection circuit 100D is configured to avoid the need to mix the received signal. Instead, the received signal is amplified, filtered, and analyzed via FID (free induction decay), directly. This direct FID analysis allows a non-complex single channel signal detection and advantageously reduces the complexity of the signal analysis circuitry (no complicated FT's). FIG. 13 shows a graphic comparison of a direct detection method with a typical mixed-down (two channel FID). The original FID frequency is 75.1 kHz and the associated $T_2^*$ is 5.16 ms. The mixed-down FID frequency is 200 Hz. Both channels of the mixed-down FID underestimate the peak-to-peak amplitude of the signal. Further detuning can provide more oscillations but signal strength can be reduced because the exictation pulse is applied farther from the resonance of the spins. The direct-detect FID method allows operation directly on the resonance of the NMR coil and the spins. Many of the oscillations occur before de-phasing so that a more accurate measurement of peak-to-peak amplitude can be made.

The polarization is proportional to the peak-to-peak amplitude of the FID, which can be analyzed using cursors or relatively inexpensive peak detection circuitry. In this preferred method, numerous cycles occur in the direct-detect mode before attenuation due to $T_2^*$ sets in. Accordingly, this direct-detect method is more accurate over conventional mixed down FID measurements. Further, because of the elimination of the requirement for homodyning, one can operate directly on the coil response resonance which also allows for improved accuracy. Of course, other polarimetry configurations can be used as is known to those of skill in the art. See e.g., Saam et al., *Low Frequency NMR Polarimeter for Hyperpolarized Gases,* Jnl. of Mag. Res., 134, pp. 67–71 (1998).

As shown in FIG. 14, it is preferred that the NMR detection circuit 100D employ a hot carrier Shotky diode gate 209 which have a 0.25V conduction voltage. This type of diode gate can reduce distortion (standard diode gates in NMR are 1N914A diodes with conduction voltages of about 0.6V). This can also reduce the ring-down time of a NMR coil after excitation to about 0.2 ms, thereby allowing the FID to be sampled about 3.5 ms earlier than other monitoring systems for hyperpolarizer units. It is also to be noted that the using a diode gate can introduce signal leakage problems. The diode gate 209 includes two diodes connected in parallel with opposite polarities. In operation, one of the diodes is always in conduction (assuming the voltage is above the diode drop) irrespective of the sign of the voltage. If the voltage is below the diode drop, then both diodes act to block and prevent any signal from passing (i.e., act as a gatekeeper). As shown in FIG. 14, the diode gates 209 act to send small signals from the coil 100 (a signal with a voltage which is below the diode voltage drop) to the receiver 305R rather than back into the transmitter 302T. However, during transmittal of the pulse (at voltages much larger than the diode voltage drop), the diode gates 209 act like a conductor to the coil 100.

As also shown in FIG. 14, the NMR detection circuit 100D preferably employs a single fixed capacitor 230 for tuning a corresponding NMR coil circuit 200. NMR coil circuits 200 are typically "tuned" by putting a capacitor "C" in parallel with the excitation coil (which has an associated inductance "L"). The coil circuit resonates at a frequency "f" and therefore can enhance response to signals at or near that frequency, while also having reduced response to noise outside of its frequency bandwidth. In typical NMR circuits, a series/parallel combination of adjustable capacitors are used to tune the circuit to resonance and to have an impedance of 50 Ohms (typically required for high-frequency operation). This type of capacitor configuration can require frequent and careful adjustments to same to ensure a properly tuned circuit. Thus, it is preferred that a single, high-precision, fixed-value capacitor be used in the NMR detection circuit 100D to tune the NMR coils described herein. This is accomplished by also using the diode gate 209 and low operating frequencies (about 1–400 kHz) in the NMR detection circuit 100D.

Flow Path Monitoring Coil

FIG. 6 illustrates an alternate hyperpolarizer unit 10 with two separate NMR coils 100, 150. As shown in FIG. 7A, the second NMR coil 150 is advantageously positioned along the post-polarizer or optical cell flow path 122 or adjacent the cell exit port 22b. This positioning can provide a more reliable level of polarization of the gas as it actually exits the cell 22, rather than the level conventionally monitored by NMR coil's typically mounted beneath the center portion of the optical cell. Although the conventional configuration can give good readings absent flow, during flow, the gas passing over the coil is typically not fully polarized compared to the level it should obtain as it ultimately flows out of the exit port of the optical cell. Thus, the position of a NMR coil 150 adjacent the polarizer cell outlet 22b can give a NMR signal level commensurate with the flow of the gas as it exits the polarizer cell 22, and, as such, can provide an improved production control measurement parameter for the polarization level of the gas achieved at this process flow point. Although shown in a preferred embodiment with a xenon substantially continuous flow optical cell 22, this flow path monitoring can, of course, also be used with batch mode hyperpolarizers (typically used to produce hyperpolarized $^3$He). This can allow a convenient NMR coil measurement prior to dispensing but in the gas exit flow path adjacent the polarizer cell 22.

FIG. 7B illustrates a fabrication technique for including such a monitoring coil 150 on the cell exit leg 22b adjacent the major cell body. As will be appreciated by one of skill in the art, the polarizer cell 22 is typically formed by a skilled molten glass-forming artisan. Thus, typically, the glass body is formed and then the legs are formed therein to form the optical cell 22. In order to position a NMR coil 150 along the glass body 119B adjacent the exit port 22, the conventional fabrication process can be altered as shown in FIG. 7B. In this method, the glass body 119B is formed and an upper portion of the leg 119L (the upper and lower portions 119L1, 119L2 defining the exit leg 122) is formed (blown). Next, the NMR coil 150 is slipped over the partially formed leg 119L1 and positioned to extend above the lower portion of the leg 119L2 which includes the expanded section and plumbing attachments 28 to provide the optical cell NMR monitoring coil 150 as shown in FIG. 7A. Alternatively, the NMR coil 150 can be attached to a cell body at an exit aperture region and a single integral leg 122 can be attached or drawn therethrough (not shown).

The NMR monitoring coil 150 is preferably configured with a center aperture which is sized to be slightly larger than the outer diameter of the leg 221 so that the NMR coil 150 can be slid over the leg and positioned adjacent the primary body of the optical cell, while also being sized and configured to be held securely thereagainst. The glass body 119B and legs 119L1, 119L2 can be formed from PYREX®. Alternatively, the body and legs can be formed of materials which are substantially non-paramagnetic and non-conducting such as aluminosilicates and the like.

In operation, it is preferred that for NMR coils 150 positioned along the exit flow path arm of the cell 22, the flow of the hyperpolarized gas is temporally stopped or slowed while the polarization measurement signal is obtained in the NMR coil 150 to maintain a sufficient quantity of the polarized gas proximate to the NMR coil 150 while the FID signal is obtained. For example, xenon gas is passed at a desired flow rate through the polarizer cell 22 and out of the exit port 22b. The valves can be temporarily closed to cease the flow of the polarized gas out of the exit port 22b, receive the NMR signal via the NMR coil on the outlet arm 150, and re-start the flow of the polarized gas. This flow interruption time cycle is preferably short, such as under 10 seconds. Of course, a bleed line (not shown) can also be positioned in fluid communication with the exit port 22b and used to direct a small quantity of the polarized gas to an in-process measurement NMR coil (such as the dual symmetry NMR coil or another separate NMR coil (not shown)) in a homogeneous field region of the hyperpolarizer for a in-process flow reading, thus not requiring the flow to be suspended for a reliable flow path measurement. Alternatively, the NMR coil 150 can abut the cell itself and be configured and sized about the cell to provide reliable information about the polarization of the gas as it approaches the cell exit. Of course, other flow path NMR coil configurations can also be used such as other plumbing or valve configurations to direct and capture a sufficient quantity of gas in the flow path to measure the polarization of the gas in the flow path. Advantageously, signal information representative of the polarization of the flowing gas can allow for more precise process parameter adjustment (such as in the operation of the optical cell) and real-time process information.

Although FIG. 6 illustrates the hyperpolarizer 10' with both the NMR monitoring coil 150 and the dual symmetry coil 100, the present invention is not limited thereto. For example, the hyperpolarizer 10' can be alternatively configured with just the outlet arm NMR monitoring coil 150, and/or with the NMR monitoring coil 150 spatially translated to be mounted at a different position along the optical cell exit leg.

Cryogenic Monitoring

FIG. 8 illustrates yet another embodiment of a hyperpolarizer unit 10" according to the present invention. In this embodiment, the hyperpolarizer unit 10" includes a cryogenic NMR monitoring coil 175. As shown, this monitoring coil 175 is preferably positioned in the hyperpolarizer unit 10" to monitor the polarization of the collected, i.e., frozen (iced) polarized gas. Because this monitoring coil 175 can be exposed to extreme conditions (cryogenic temperatures), it is preferred that the NMR monitoring coil 175 be formed of body and wire materials which are suitable for same. One example of a suitable wire is a thermoplastic coated copper wire, other suitable materials include Ultem®, Nylatron®, or Torlon® polymers and the like. Of course, the resistance of the wires at the lower temperatures will be reduced and the NMR detection circuit 100D' is preferably configured to account for temperature-induced variance. The lower resistivity of the wire may improve the "Q" of this circuit, but, as will be appreciated by those of skill in the art, the lower resistivity is typically insubstantial when compared to inter-wire capacitance in low-field applications (which dominates the "Q" of the circuit). That is, the NMR coils of the present invention employ numerous windings (typically 100–300) compared to a few turns of wire on a coil for typical high-field applications (where the "Q" can be dominated by wire resistivity).

The cryogenic NMR monitoring coil 175 can be configured in several ways. In one preferred embodiment, as shown in FIG. 9, the NMR coil 175 is configured as a solenoid which is positioned around the collection chamber of the cold finger 30. As shown in FIG. 9A, the NMR coil 175 is configured as a solenoid 175a (in contrast to the surface coil type 175b shown in FIG. 10) to wrap around a lower portion of the exterior of the cold finger 30 or collection chamber itself. Preferably, the solenoid 175a can be configured and sized to extend and proximate to the exterior of the cold finger such that it is proximate to substantially the entire ice reservoir or holding region of the collection chamber (i.e., the region where the frozen gas is positioned).

As is well known to those of skill in the art, for the NMR measurement to operate properly, the magnetic field source is preferably configured to generate a magnetic field which is transversely oriented (perpendicular or normal) to the direction of the field associated with the pulsing of the corresponding NMR coil. Therefore, the magnetic field source operably associated with the cryogenic NMR coil 175 (whether permanent magnets 40 or electromagnets 40') is configured to generate the appropriately directed magnetic field as well as a sufficient degree of homogeneity for the NMR measurement.

FIG. 9 illustrates the magnetic field source for the cryogenic NMR coil 175 as a set of permanent magnets 40. However, the magnetic field source can also be configured as an electromagnet or solenoid 400 and positioned to be spatially separated with the cold finger 30 intermediate thereof about the lower region of the cold finger which holds the frozen gas. In operation, the magnitude of the magnetic field source (shown for example as a permanent magnet 40 in FIG. 9 and an electromagnet 400 in FIG. 11) is preferably configured to generate a substantially fixed or constant low-level magnetic field of at least about 500 G so that the resonant frequency of $^{129}$Xe is about 589 kHz. Allowing about 300 pF of capacitance in the signal measuring/detection circuit to resonate the collected frozen gas, it is preferred that the NMR coil 175a is configured with an inductance of about 0.24 mH or less. In addition, because the magnetic field is substantially fixed, it is preferred that the measurement or detection circuit is tunable with some amount of variable capacitance to adjust the tuning to match the Larmor frequency of the frozen $^{129}$Xe. In a preferred embodiment, the cryogen based NMR coil 175a and associated detection circuit is configured with a capacitance which includes a tunable amount of about 0–100 pf, and about 100 pf due to cabling or wiring, and about a 100 pF fixed capacitor. Preferably, the NMR coil 175a is sized such that it covers (extends about) the entire $^{129}$Xe ice collection region. For example, a NMR coil 175a with a winding length of about 2 cm and a radius of about 1 cm may be suitable. In this example, about 220 turns of wire will provide about 0.24 mH inductance.

In operation, the applied static magnetic field ($B_0$) is oriented to be perpendicular or normal to the NMR coil RF field ($B_1$) provided by the NMR coil. Thus, if $B_0$ is transverse, then $B_1$ is axial, or if $B_0$ is axial, then $B_1$ is transverse. For clarity, the axial direction means the direction which is parallel to or collinear with the upright cold finger 30 (shown in position in FIGS. 10 and 11).

Figure 11:
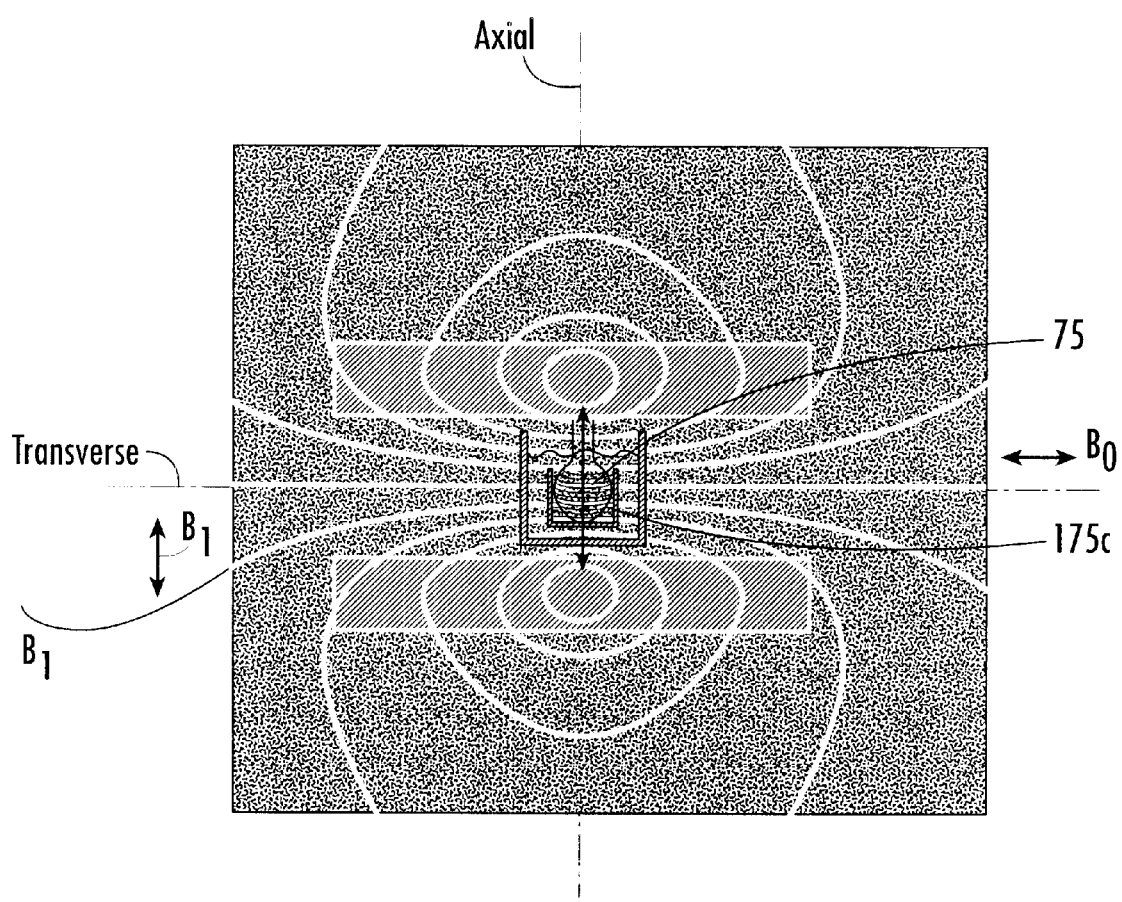
FIG. 11 is a schematic illustration of a front view of a static magnetic holding field applied to an electromagnet or solenoid coil at the cold finger according to one embodiment of the present invention.

In a preferred embodiment, to generate a transverse magnetic field $B_0$, a pair of opposing ceramic magnets are used as described above and the corresponding $B_1$ is thus axial and applied via a NMR coil 175a configured as a solenoid. However, as is known to those of skill in the art, an electro-magnet coil 40' (such as a Helmholtz pair) can also be configured to generate a transverse static magnetic field $B_0$. Another alternative is to use a transversely oriented solenoid for the static field with an axially oriented $B_1$ associated with the NMR coil 175a as schematically shown in FIG. 11. Electro-magnet configurations which provide suitable axial fields include a relatively large solenoid for an axial $B_0$ (such as 20–30 cm long and 10 cm in diameter) and a small solenoid associated with the $B_1$ of the NMR coil (such as 2 cm long and 2 cm in diameter).

In conventional cryogenic accumulators, the typical magnetic field strength surrounding the frozen accumulated polarized gas is provided by a permanent magnet arrangement generating a relatively low field and not particularly homogeneous magnetic field. The homogeneity generated thereby is suitable for frozen gas which is not particularly susceptible to magnetic gradients, but unfortunately the permanent magnet arrangement used in the past is generally not homogeneous enough for sensitive and/or precision NMR measurement. See e.g., U.S. Pat. No. 5,809,801 to Cates et al. and U.S. patent application Ser. No. 08/989,604 to Driehuys et al. for more details of the cryogen permanent magnet yoke.

Figure 10:
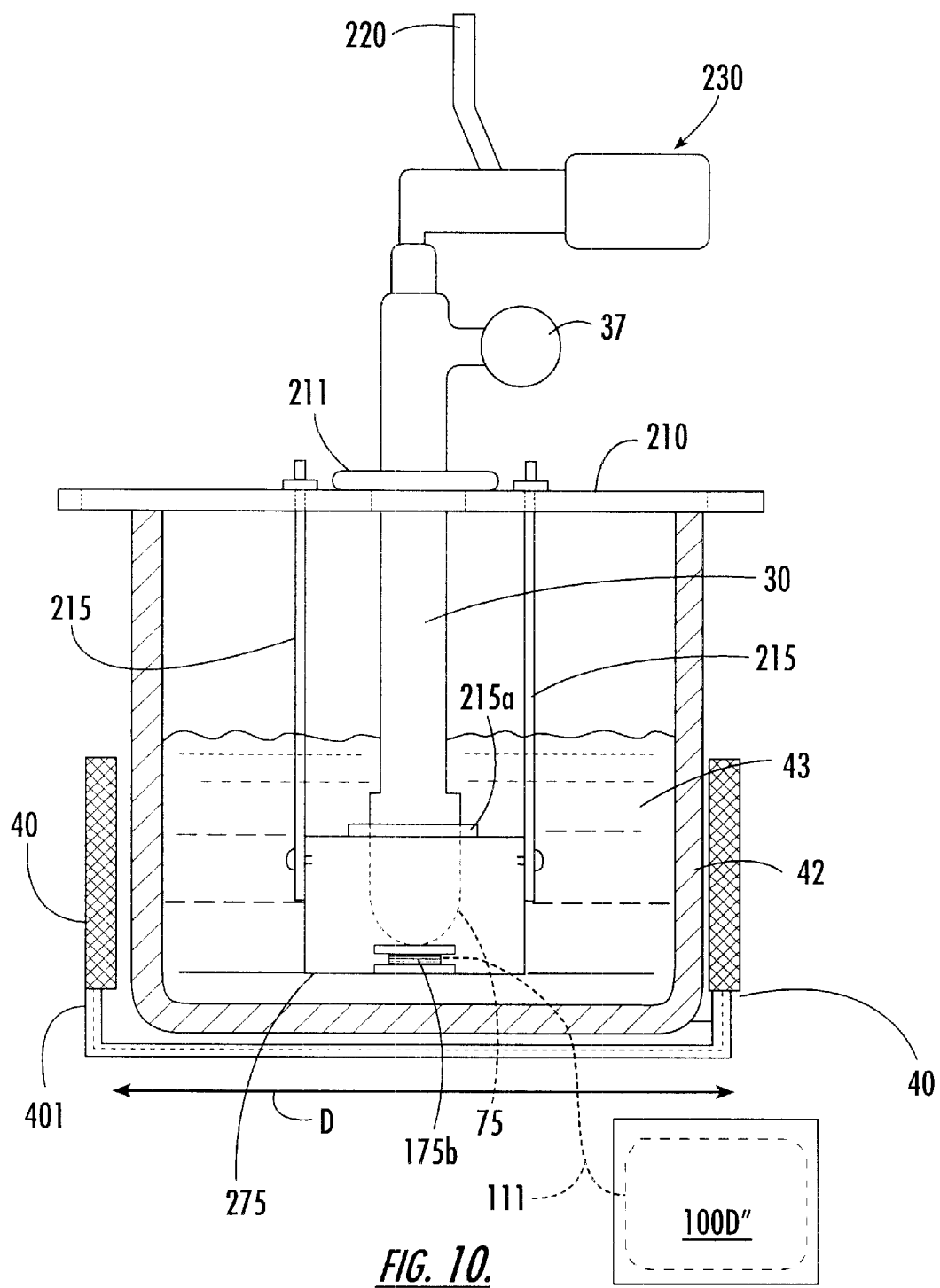
FIG. 10 is a schematic side section view of a cryogenically positioned NMR surface coil and externally positioned permanent magnets (i.e., permanent magnets positioned on external to the cryogen bath) according to one embodiment of the present invention.

Therefore, in a preferred embodiment as shown in FIG. 10, when a permanent magnet arrangement is employed with the cryogenic NMR coil monitor 175, it is preferred that the permanent magnet arrangement 40' be modified to fit outside the cryogen bath 43. Preferably, the permanent magnet arrangement 40' is sized and configured to produce a magnetic field of from 1–2000 Gauss, more preferably about 50–1000 Gauss, and still more preferably about 500–1000 Gauss. It is also preferred that the magnet field have a homogeneous region sufficient to extend across the lower portion of the cryogenic compartment. Preferably, the homogeneity is sufficiently high so that gradient induced $T_2^*$ is longer than the $T_2$ of the ice. For example, longer than about 1 ms, which is the intrinsic $T_2$ associated with solid $^{129}$Xe at 77K. See Yen et al., *Nuclear Magnetic Resonance of 129Xe in Solid and Liquid Xenon,* Phys. Rev. 131, 269–275 (1963).

Preferably, in order to obtain sufficient homogeneity, the permanent magnet arrangement 40 is configured with a physically larger magnet assembly relative to that used for the cryogen cold finger accumulation in the past. For example, one configuration is to employ about 20 cm diameter magnets (disks) with magnet poles which are separated across the dewar or liquid cryogen bath container by a separation distance of about 8 cm which can provide about a 500 Gauss field with sufficient homogeneity about the desired region. Stated differently, a set of discrete permanent magnets 40 are positioned opposing the other across the outer wall of the dewar flask or cryogen bath container 43 such that the diametrically opposed permanent magnets 40 have a diametric separation of about 8 cm (3 in). Alternatively, the permanent magnets 40 can be a series of stronger field ceramic magnets (the latter can increase the field strength generated by same).

As shown in FIG. 10, the permanent field disk magnets 40 can be aligned by a structural yoke 401 and/or can include a flux return. As will be appreciated by one of skill in the art, a flux return can increase the field strength of this arrangement while also minimizing interference from stray magnetic flux. The flux return can be configured as a soft iron material. Alternatively, in lieu of a yoke 401, the magnets 40 can themselves be secured to the outside wall of the cryogen container or flask 42 holding the cryogen bath 42 or otherwise supported to provide the desired spatial separation and alignment. Of course, as will be appreciated by those of skill in the art, other magnet geometry configurations can be used to provide a suitable magnetic field strength and homogeneity.

FIG. 10 also illustrates an accumulator and magnet assembly 230. The accumulator 30 is supported by a support platform 210 positioned over the cryogen bath 43. The magnets are separated a distance "D" and positioned external to the cryogen bath 43. As discussed above, the separation distance "D" is at least about 8 cm for a magnet disk having about a 20 cm diameter. A pair of plates 215 longitudinally extend from the support platform 210 and connect to the bottom of the holding assembly 275 which is sized to hold the NMR coil 175*b* to contact the bottom of the collection reservoir 75 of the accumulator 30 to provide the desired magnetic field to the collected polarized gas. As shown, the accumulator 30 includes a support contact portion 211, which is configured to rest against the support platform 210 and has a lateral support member 215*a* which extends to hold the top portion of the collection reservoir 75. In any event, the accumulator 30 is preferably immersed in the cryogen bath 43 such that the reservoir 75 and about 3–6 inches of the tube are immersed. If submerged in liquid nitrogen, the exterior wall of the outer sleeve 103 and the exterior wall or the reservoir 75 will be at about 77°K. The freezing point of xenon is approximately 160°K. Thus, upon exiting the primary flow path 80, the hyperpolarized gas hits the cold surface and freezes into the reservoir 75 while the buffer gases exit the accumulator via an exit channel 90 (not shown). The reservoir 75 can include a surface coating to help prevent relaxation caused by the polarized gas's contact with same. FIG. 11 illustrates the NMR coil 175*c* alternatively configured and positioned as a solenoid type excitation coil which extends about the length "L" of the accumulation bulb or reservoir 75 and is preferably configured to contact or extend in close proximity to the exterior of same (a cryogen immersed portion) of the reservoir 75.

Figure 12:
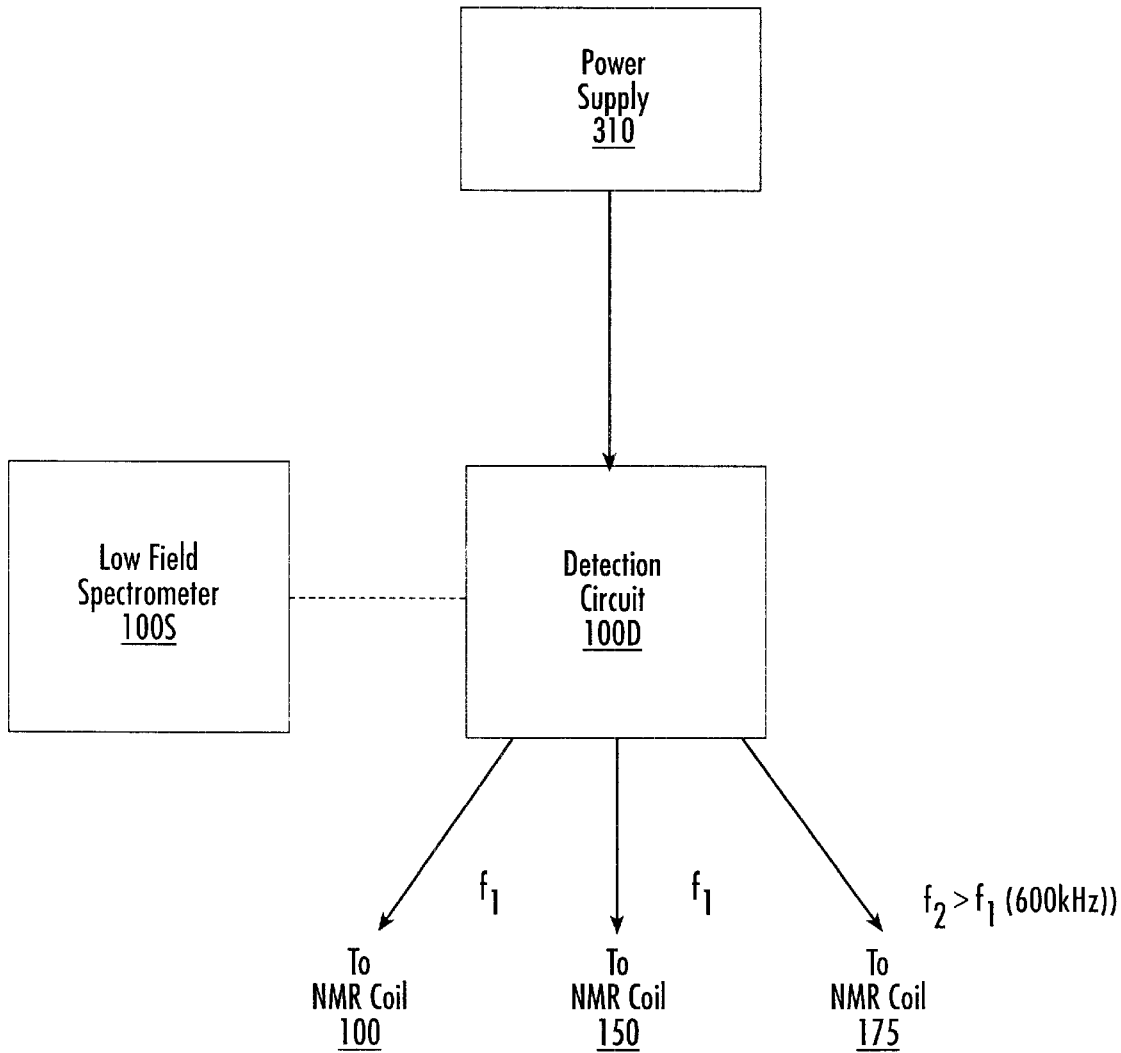
FIG. 12 is a schematic illustration of an electric circuit for a hyperpolarizer with multi-NMR coils according to the present invention.

FIG. 9 illustrates a hyperpolarizer unit 10''' with a multi-point polarization monitoring system. This embodiment includes the first NMR coil 100 positioned adjacent the optical cell 22 and secondary reservoir 120, the second NMR monitoring coil 150 positioned adjacent the optical cell exit 22, and the third cryogenic NMR monitoring coil 175 positioned to monitor the polarization of the frozen gas. FIG. 9 also illustrates an evacuated bag or vessel 525 attached to the dispensing outlet 50 and the secondary flow path 115 in fluid communication with the exiting gas flow path proximate the gas dispensing port 50. FIG. 12 schematically illustrates a hyperpolarizer detection circuit for a multi-NMR coil monitoring system.

Although particularly suited for cryogenically accumulated $^{129}$Xe, the instant multi- or dual-polarization monitoring method can also successfully be employed on a hyperpolarizer used with other hyperpolarized noble gases such as $^{3}$He.

Preferably, the NMR coils 100, 125, 175 of the instant invention are high precision NMR coils. That is, it is preferred that the NMR coils are designed and produced in a reliable and substantially consistent manner (such as to controlled tolerance and controlled manufacturing processes, preferably to six sigma production standards). This allows the hyperpolarizer to establish a calibration standard which is substantially the same for a particular position on the hyperpolarizer across replacement modules.

Operation

A "$T_1$" decay constant associated with the hyperpolarized gas' longitudinal relaxation time is often used to describe the length of time it takes a gas sample to depolarize in a given situation. As noted above, the handling of the hyperpolarized gas is critical because of the sensitivity of the hyperpolarized state to environmental and handling factors and the potential for undesirable decay of the gas from its hyperpolarized state prior to the planned end use, i.e., delivery to a patient for imaging. Processing, transporting, and storing the hyperpolarized gases—as well as delivering the gas to the patient or end user—can expose the hyperpolarized gases to various relaxation mechanisms such as magnetic gradients, contact-induced relaxation, hyperpolarized gas atom interactions with other nuclei, paramagnetic impurities, and the like.

Referring now to FIG. 14, generally described, a selected RF excitation pulse (of predetermined frequency, amplitude, and duration) is transmitted from a pulse generator 300 via an amplifier 302 through a set of diode gates 209 to the surface coil 100. The transmitted excitation pulse locally excites the hyperpolarized gas (or frozen gas) sample 250. The circuit 100D may include a switching means 302S (electrical, mechanical, or program/software directed switches) to switch between the differently located detection coils in the production cycle. Alternatively or in addition to the switching means 302S, for high-frequency ice measurements an alternate transmitter 302T circuit may be employed. Of course, an alternate receiver circuit or additional components associated therewith can also be employed (not shown).

The hyperpolarized gas 250 responds to the excitation pulse inducing a response signal back to the receiver 305R through an amplifier 305 (optionally filtered) and then to the computer driven interrogation signal analyzer 309. Thus, a response signal is received corresponding to the response of the gas to the excitation pulse. The received signal is analyzed (preferably peak to peak, direct FID detection) to determine the polarization of the hyperpolarized gas. Conveniently, the relatively non-complex analysis does not require a computer or complex signal processor, but can instead employ a peak detector analysis circuit.

Preferably, the excitation pulse is a RF pulse having a selected pulse time and frequency which corresponds to the strength of the magnetic field and the particular hyperpolarized gas. Preferably, frequencies used for $^3$He gas phase are about 75 kHz (with a static magnetic field of about 23.4 G) or more (with an associated change in the magnetic field strength). An alternative preferred frequency is about 24 kHz with the frequency for gaseous $^{129}$Xe also being preferably about 24 kHz (with the frozen phase frequency being increased, i.e., being a higher frequency than the gas excitation pulse frequency). Thus, 24 kHz can be used for both $^{129}$Xe and $^3$He. Because $^3$He has a larger magnetic moment (2.7 times) compared to $^{129}$Xe, the magnetic field used for $^3$He is typically smaller at a similar frequency. Thus, for 24 kHz, about a 20 (20.4) G field is preferably used for $^{129}$Xe while about a 7 (7.5) G field is used for $^3$He. The $^{129}$Xe resonance frequency is proportional to field strength by the known ratio of 1.18 kHz/G; thus, as noted, for a 20 G field, the frequency is about 24 kHz while for a 500 G field a suitable frequency for gaseous xenon is about 600 kHz. The higher detection frequency preferably used for the $^{129}$Xe ice (frozen phase gas) is related to the fact that $T_1$ is longer at 500 G. Therefore, for a multi-point process monitoring hyperpolarizer, the NMR detection circuit 100D (FIG. 12) is preferably configured to transmit a first pulse at a first frequency ($f_1$) for the NMR coils 100, 125 and a second higher frequency ($f_2$) for the ice-positioned NMR coil 175. In any event, the RF pulse generates an oscillating magnetic field which misaligns a small fraction of the hyperpolarized gas (i.e., $^3$He or $^{129}$Xe) nuclei from their static magnetic field alignment position. The misaligned nuclei start precessing at their associated Larmour frequency (corresponding to pulse frequency). The precessing spins induce a voltage in the NMR surface coil 100. The voltage is received back (typically amplified) and the signal is a FID signal. The initial peak-to-peak voltage of this signal is directly proportional to polarization (using a known calibration constant). Saam et al. includes more discussion on one way to establish calibration standards. See Saam et al., supra.

Preferably, each of the NMR coil embodiments 100, 150, 175 described herein include an input/output line such as single coaxial signal line (handles both the transmit/receive signal) 111 (FIG. 8) which is operably associated with the transmitter 302T and-receiver 302R portions of the detection circuit 100D (FIG. 14). In operation, the pulse generator 309 will preferably be configured to provide an increased signal frequency for the ice and operate recognizing that the $T_2^*$ of the ice will be decreased over that of the gas.

The excitation pulse of the instant invention is selected such that it can reliably determine the level of polarization while minimally depolarizing the gas. The optimal pulse voltage depends on several factors. Preferably, for the measurement of the ice collected hyperpolarized gas, the NMR coil 175a is configured to encompass substantially all of the collected frozen (ice phase) hyperpolarized gas in the cold finger 30. In operation, a plurality of pulses with extremely small flip angles are used to excite the frozen gas. As used herein, "extremely small" means pulse angles of less than about 5 degrees, and preferably in the range of about 1–2 degrees. The extremely small pulse flip angles minimize the depolarizing effect of the signal measurement on the gas/ice. This is attributed to the relationship between the flip angle associated with the excitation pulse and the retained polarization. The signal per pulse flip angle is proportional to the sine of the pulse angle (theta), while the retained magnetization is proportional to the cosine of the pulse flip angle (theta). For example, for a pulse flip angle of about 2 degrees, the cosine of theta is 0.994. Therefore, even if ten (2) degree flip angle pulses were taken of the sample, this should leave the sample with about 99.3% of the original magnetization and minimally affect the original signal strength associated with the unmeasured polarization of the hyperpolarized frozen gas. Thus, extremely small flip angles are preferred because one can expect a substantial signal from the frozen or iced hyperpolarized gas and the signal is relatively strong even with this small flip angle because there is both hyperpolarization and the high density of a solid (the solid phase provides about a 1000 time increase over gas phase densities). At a frequency of about 589 kHz and employing the 220 turn coil 175a having an inductance of about 0.24 mH as discussed in a preferred embodiment for the NMR coil 175a (FIG. 9A) above, and using a 1V pulse, will yield about 2 degrees of flip angle in the iced sample.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clause are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A hyperpolarizer for producing polarized noble gases, comprising:

an optical pumping cell having a non-polarized gas inlet port and a polarized gas outlet port;

a magnetic field source operably associated with said optical pumping cell, said magnetic field source configured to provide a region of homogeneity;

a NMR rf coil having first and second opposing ends, said first end positioned adjacent said optical pumping cell within said region of homogeneity;

a cryogenic accumulator in fluid communication with said optical pumping cell outlet port;

a polarized gas dispensing outlet in fluid communication with said cryogenic accumulator;

a polarized gas exit flow line extending between said cryogenic accumulator and said polarized gas dispensing outlet; and a secondary reservoir positioned adjacent said NMR rf coil second end in fluid communication with said polarized gas exit flow path;

wherein said NMR rf coil is configured and arranged between said optical cell and said secondary reservoir such that a quantity of gas positioned in either the optical cell or the secondary reservoir can be excited with said NMR rf coil.

2. A hyperpolarizer according to claim 1, wherein said magnetic field source defines a region of homogeneity which includes a portion of said optical pumping cell and a volume which extends a distance below said optical pumping cell, and wherein said NMR rf coil is positioned on a bottom portion of said optical pumping cell, and wherein said NMR rf coil and at least a portion of said secondary reservoir are positioned within said region of homogeneity.

3. A hyperpolarizer according to claim 1, wherein said secondary reservoir has an open first end and a second opposing closed end and is configured to capture a small representative volume of hyperpolarized gas therein, and wherein said closed second end is positioned in abutting contact with said NMR rf coil second end.

4. A hyperpolarizer according to claim 3, wherein said cryogenic accumulator is configured to accumulate polarized gas in a frozen phase and to release gas in a post thaw gaseous phase, and wherein said secondary reservoir is configured to receive a quantity of the post-thaw polarized gas from said gas exit flow path and position a sample of said post-thaw gas in said secondary reservoir adjacent said NMR rf coil second end.

5. A hyperpolarizer according to claim 3, wherein said secondary reservoir closed second end has a substantially planar face portion which contacts said NMR rf coil second end.

6. A hyperpolarizer according to claim 1, said hyperpolarizer further comprising a quantity of hyperpolarized gas, and wherein said polarized gas comprises hyperpolarized $^{129}$Xe.

7. A hyperpolarizer according to claim 1, further comprising an NMR polarization detection circuit operably associated with said NMR rf coil, and wherein said NMR detection circuit is configured to detect the excitation corresponding to the polarized gas both in said optical cell and said secondary reservoir.

8. A hyperpolarizer according to claim 1, wherein said optical pumping cell has a center portion, and wherein said magnetic field source is configured such that said region of homogeneity is longitudinally offset a distance from said optical cell center portion.

9. A hyperpolarizer according to claim 1, wherein said secondary reservoir is sized to have an internal free space of less than about 5 cubic centimeters.

10. A hyperpolarizer according to claim 1, wherein said NMR rf coil is configured as a dual symmetry NMR rf coil for selectively monitoring the level of polarization associated with polarized gas in both the optical pumping cell and the secondary reservoir, said NMR rf coil comprising:

a coil body having first and second opposing flanges and an intermediate coil receiving section positioned therebetween;

a wire coil configured with a plurality of turns positioned about said intermediate coil receiving section, wherein said first flange has a first thickness and said second flange has a second thickness, and said first and second thicknesses are substantially the same, and wherein said NMR rf coil is configured and arranged to selectively monitor the level of polarization associated with two separate quantities of hyperpolarized noble gas, each being located adjacent a respective one of the first and second flanges.

11. A hyperpolarizer for producing polarized noble gases, comprising:

an optical pumping cell having a primary body having a non-polarized gas inlet port and a longitudinally extending polarized gas outlet port with an outer surface; and an NMR rf coil having first and second opposing ends and defining a center aperture therethrough, said NMR rf coil positioned on said outlet port such that a portion of said outlet port extends through said NMR rf coil aperture, said NMR rf coil first end being positioned adjacent said primary body of said optical pumping cell, wherein said NMR rf coil is configured such that during operation of said hyperpolarizer said NMR rf coil is able to excite a quantity of polarized gas positioned proximate to said optical cell outlet port.

12. A hyperpolarizer for producing polarized gas according to claim 11, wherein said optical pumping cell gas inlet port is separate from said outlet port, and wherein said hyperpolarizer further comprises a polarized gas dispensing outlet downstream of and in fluid communication with said optical pumping cell and an exit flow path extending from said optical cell outlet port to said polarized gas dispensing outlet, and wherein said hyperpolarizer further comprises a magnetic field source operably associated with said optical pumping cell so that said magnetic field source provides a magnetic field which spatially extends over at least a portion of said optical pumping cell, said magnetic field source configured to provide a region of homogeneity in the magnetic field which extends a distance sufficient to cover the optical cell outlet port, said region of homogeneity being sufficiently homogeneous to allow a reliable measurement of the polarization of the polarized gas proximate said optical cell outlet port.

13. A hyperpolarizer according to claim 12, further comprising a cryogenic accumulator positioned in the exit flow path such that it is in fluid communication with and intermediate of said optical cell outlet port and said dispensing outlet.

14. A hyperpolarizer according to claim 13, further comprising a secondary reservoir in fluid communication with said exit flow path and positioned relative to said exit flow path such that it is intermediate of said cryogenic accumulator and said dispensing outlet.

15. A hyperpolarizer according to claim 12, wherein said magnetic field region of homogeneity has a center location associated therewith, and wherein said an optical pumping cell primary body has a center location associated therewith, and wherein said magnetic field center is longitudinally offset from said primary body center location in a direction which is toward said optical cell outlet port.

16. A hyperpolarizer according to claim 15, further comprising a second NMR rf coil having opposing first and second sides, said second NMR rf coil positioned so as to contact said optical cell primary body on one side and said secondary reservoir on the other side to be able to selectively measure the polarization of gas held either in said secondary reservoir or said optical cell primary body.

17. A hyperpolarizer according to claim 13, wherein said cryogenic accumulator includes a polarized gas collection container in fluid communication with the optical pumping cell, said collection container having an inlet and a closed collection end, a cryogenic liquid bath, and a set of permanent magnets positioned in said cryogenic bath, and wherein said hyperpolarizer further comprises another NMR rf coil positioned in said cryogenic bath proximate to said collection end to measure the polarization of polarized gas held in said cryogenic accumulator.

18. A hyperpolarizer for producing optically pumped polarized noble gases, comprising:

an optical pumping cell having a primary body with an unpolarized gas inlet port and a polarized gas outlet port;

a cryogenic accumulator in fluid communication with said optical pumping cell outlet port, comprising;

an elongated closed end tube defining a polarized gas collection chamber for holding a quantity of collected polarized gas therein, said gas collection chamber being operably associated with first and second sealable valves, said first valve positioned upstream of said collection chamber to control the flow of gas therein and said second valve positioned downstream of said collection chamber to control the flow of gas thereout;

a cryogenic bath, wherein said collection chamber is immersed into said cryogenic bath;

a magnetic field source arranged to provide a magnetic field with a region of homogeneity adjacent said collection chamber in said cryogenic bath;

a first NMR rf coil positioned in said cryogenic bath adjacent said closed end of said tube in said magnetic field region of homogeneity, wherein said NMR rf coil is configured to have an inductance of about 0.24 mH or less;

a polarized gas-dispensing outlet in fluid communication with said cryogenic accumulator; and a polarized gas exit flow path extending from said cryogenic accumulator to a polarized gas dispensing outlet, wherein said first NMR rf coil is configured such that during operation of said hyperpolarizer, said first NMR rf coil monitors the level of polarization associated with the collected polarized gas held proximate to the closed end of said elongated tube.

19. A hyperpolarizer according to claim 18, said hyperpolarizer further comprising a second NMR coil positioned adjacent said optical pumping cell primary body.

20. A hyperpolarizer according to claim 19, further comprising a secondary reservoir positioned adjacent said second NMR rf coil and in fluid communication with said polarized gas exit flow path, wherein said second NMR rf coil is configured and arranged to be adjacent said optical cell and said secondary reservoir such that during operation of said hyperpolarizer said second NMR rf coil excites a quantity of polarized gas positioned in said optical cell and a quantity of polarized gas positioned in said secondary reservoir corresponding to the location of the polarized gas in the hyperpolarizer during the production cycle.

21. A hyperpolarizer according to claim 18, wherein said first NMR rf coil is configured as a solenoid longitudinally extending around a portion of the exterior of said elongated tube.

22. A hyperpolarizer according to claim 18, said cryogenic bath comprising a container with an outer wall and a quantity of cryogenic liquid held therein, and wherein said magnetic field source is a set of permanent field magnets extending about the outer wall of said cryogenic bath container adjacent said collection chamber such that said permanent field magnets are unimmersed in the liquid in said cryogenic bath.

23. A hyperpolarizer according to claim 18, wherein said magnetic field source is an electro magnet.

24. A method of monitoring the polarization level of hyperpolarized noble gas during production thereof, comprising the steps of:

polarizing a quantity of noble gas in an optical pumping chamber configured to hyperpolarize noble gas via spin-exchange with optically pumped alkali metal vapor;

directing the polarized noble gas in the optical pumping chamber to a gas flow path;

providing a magnetic field having a region of homogeneity, the region of homogeneity including at least a volume of space associated with a portion of the optical pumping chamber and the gas collection path proximate to the optical pumping chamber;

positioning a first NMR rf coil adjacent the gas flow path in the magnetic field region of homogeneity;

exciting the polarized gas by transmitting an excitation signal to the first NMR rf coil;

measuring the level of polarization associated with the hyperpolarized gas adjacent the NMR rf coil via NMR polarimetry using the NMR coil to thereby monitor the level of polarization associated with the polarized gas in a region of the polarizer adjacent the polarized gas flow path;

cryogenically accumulating the polarized gas in a cryogenic accumulator, wherein a portion of said polarized gas is frozen; and subsequently thawing said frozen polarized gas prior to said dispensing step and after said thawing step;

wherein during or after said thawing step, a minor portion of the quantity of thawed polarized gas is directed away from a major portion of the hyperpolarized gas into the gas flow path proximate to the NMR coil.

25. A method according to claim 24, wherein the NMR rf coil is connected to an NMR detection circuit, and wherein the same NMR rf coil is used to determine the polarization of the hyperpolarized gas in the optical pumping cell and after said thawing step by the NMR rf coil positioned at a stationary location between the optical pumping cell and the gas flow path at a location downstream of the cryogenic accumulator.

26. A method according to claim 24, wherein the noble gas is $^{129}$Xe and wherein the exciting step excites the minor portion of thawed polarized gas to provide a representative polarization level of the hyperpolarized gas after said thawing step.

27. A method according to claim 24, further comprising the step of orienting the magnetic field region of homogeneity such that the magnetic center location thereof is longitudinally offset from a center portion defined by the physical center of the optical pumping chamber in a direction toward the bottom of the optical pumping chamber so that the same NMR rf coil can be positioned within the region of homogeneity to selectively determine the polarization of the gas in the pumping cell and the gas which has been cryogenically accumulated and then thawed.

* * * * *